(12) United States Patent
Katine et al.

(10) Patent No.: US 12,414,307 B2
(45) Date of Patent: Sep. 9, 2025

(54) CROSS-POINT MAGNETORESISTIVE MEMORY ARRAY INCLUDING SELF-ALIGNED DIELECTRIC SPACERS AND METHOD OF MAKING THEREOF

(71) Applicant: SANDISK TECHNOLOGIES LLC, Addison, TX (US)

(72) Inventors: Jordan Katine, Mountain View, CA (US); Lei Wan, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 765 days.

(21) Appl. No.: 17/654,777

(22) Filed: Mar. 14, 2022

(65) Prior Publication Data

US 2023/0292528 A1    Sep. 14, 2023

(51) Int. Cl.
*H10B 61/00* (2023.01)
*G11C 11/16* (2006.01)
(Continued)

(52) U.S. Cl.
CPC .......... *H10B 61/10* (2023.02); *G11C 11/1655* (2013.01); *H10N 50/01* (2023.02);
(Continued)

(58) Field of Classification Search
CPC .. H01L 27/224; H01L 27/228; G11C 11/1655
See application file for complete search history.

(56) References Cited

U.S. PATENT DOCUMENTS 7,474,723 B2    1/2009  Oyama
7,502,211 B2    3/2009  Gill
(Continued)

FOREIGN PATENT DOCUMENTS

WO    WO 2019/005162 A1    1/2019
WO    WO 2019/005172 A1    1/2019
(Continued)

OTHER PUBLICATIONS

Notification of Transmittal of the International Search Report and Written Opinion of the International Search Authority for International Patent Application No. PCT/US2019/068899, mailed Apr. 26, 2020, 12 pages.
(Continued)

*Primary Examiner* — Davienne N Monbleau
*Assistant Examiner* — Heim Kirin Grewal
(74) *Attorney, Agent, or Firm* — THE MARBURY LAW GROUP PLLC

(57) ABSTRACT

Selector material layers are formed over the first electrically conductive lines, and magnetic tunnel junction material layers are formed over the selector material layers. The magnetic tunnel junction material layers are patterned into a two-dimensional array of magnetic tunnel junction (MTJ) pillar structures. A dielectric spacer material layer is deposited over the two-dimensional array of MTJ pillar structures. The dielectric spacer material layer and the selector material layers are anisotropically etched. Patterned portions of the selector material layers include a two-dimensional array of selector-containing pillar structures. Second electrically conductive lines are formed over the two-dimensional array of MTJ pillar structures.

5 Claims, 14 Drawing Sheets

(51) Int. Cl.
  *H10N 50/01* (2023.01)
  *H10N 50/10* (2023.01)
  *H10N 50/80* (2023.01)
  *H10N 50/85* (2023.01)

(52) U.S. Cl.
  CPC ............. *H10N 50/10* (2023.02); *H10N 50/80* (2023.02); *H10N 50/85* (2023.02); *G11C 11/161* (2013.01); *G11C 11/1659* (2013.01)

(56) References Cited

U.S. PATENT DOCUMENTS

| | | | |
|---|---|---|---|
| 7,733,685 | B2 | 6/2010 | Scheuerlein et al. |
| 9,252,362 | B2 | 2/2016 | Pio |
| 9,542,987 | B2 | 1/2017 | Naik et al. |
| 9,768,229 | B2 | 9/2017 | Braganca et al. |
| 9,830,966 | B2 | 11/2017 | Mihajlovic et al. |
| 10,163,651 | B1* | 12/2018 | Chen .................... H10N 70/063 |
| 10,229,723 | B1 | 3/2019 | Choi et al. |
| 10,249,683 | B1 | 4/2019 | Lille et al. |
| 10,381,551 | B1 | 8/2019 | Lille |
| 10,553,783 | B2 | 2/2020 | Lille |
| 10,726,892 | B2 | 7/2020 | Le et al. |
| 10,788,547 | B2 | 9/2020 | Kalitsov et al. |
| 10,797,227 | B2 | 10/2020 | Le et al. |
| 10,811,596 | B2 | 10/2020 | Le et al. |
| 10,862,022 | B2 | 12/2020 | Le et al. |
| 11,056,534 | B2 | 7/2021 | Wan et al. |
| 11,152,425 | B2 | 10/2021 | Wan et al. |
| 11,271,035 | B2 | 3/2022 | Wan et al. |
| 11,271,036 | B2 | 3/2022 | Lille et al. |
| 2005/0220150 | A1 | 10/2005 | Oyama |
| 2009/0290406 | A1 | 11/2009 | Xia et al. |
| 2009/0290409 | A1 | 11/2009 | Xia et al. |
| 2010/0054027 | A1 | 3/2010 | Xia |
| 2010/0110776 | A1 | 5/2010 | Yoon et al. |
| 2011/0049531 | A1* | 3/2011 | Oka ..................... H01L 21/565 257/E23.116 |
| 2011/0267874 | A1 | 11/2011 | Ryu et al. |
| 2012/0217615 | A1* | 8/2012 | Tatekawa ............... H01G 4/129 257/532 |
| 2013/0201757 | A1 | 8/2013 | Li et al. |
| 2013/0215675 | A1 | 8/2013 | Ryu et al. |
| 2016/0225423 | A1 | 8/2016 | Naik et al. |
| 2017/0047510 | A1 | 2/2017 | Chen et al. |
| 2017/0117027 | A1 | 4/2017 | Braganca et al. |
| 2017/0117323 | A1* | 4/2017 | Braganca ............... H10N 50/01 |
| 2017/0125078 | A1 | 5/2017 | Mihajlovic et al. |
| 2018/0358547 | A1* | 12/2018 | Yang ..................... H10B 61/10 |
| 2018/0366642 | A1 | 12/2018 | Yang et al. |
| 2019/0013353 | A1 | 1/2019 | Lee et al. |
| 2019/0027201 | A1 | 1/2019 | Petti et al. |
| 2019/0080738 | A1 | 3/2019 | Choi et al. |
| 2019/0207088 | A1 | 7/2019 | Schabes et al. |
| 2019/0287592 | A1 | 9/2019 | Matsunami |
| 2020/0006633 | A1 | 1/2020 | Lille |
| 2020/0243758 | A1* | 7/2020 | Marchack ............... H10B 61/00 |
| 2020/0342926 | A1 | 10/2020 | Katine et al. |
| 2020/0350364 | A1 | 11/2020 | Wan et al. |
| 2020/0411589 | A1 | 12/2020 | Wan et al. |
| 2021/0126052 | A1 | 4/2021 | Wan et al. |
| 2021/0217812 | A1* | 7/2021 | Hsiao .................. H01L 23/5226 |
| 2021/0313392 | A1 | 10/2021 | Wan et al. |
| 2021/0408114 | A1 | 12/2021 | Lille et al. |
| 2023/0389283 | A1* | 11/2023 | Lin ........................ H10B 61/22 |

FOREIGN PATENT DOCUMENTS

| WO | WO 2019/139774 A1 | 7/2019 |
|---|---|---|
| WO | WO 2020/222883 A1 | 11/2020 |

OTHER PUBLICATIONS

Notification of Transmittal of the International Search Report and Written Opinion of the International Search Authority for International Patent Application No. PCT/US2020/023707, mailed Jul. 28, 2020, 10 pages.

Kim, Y. et al. "Multilevel Spin-Orbit Torque MRAMs," IEEE Transactions on Electron Devices, vol. 62, No. 2, pp. 561-568, (2015).

U.S. Appl. No. 17/654,760, filed Mar. 14, 2022, SanDisk Technologies LLC.

U.S. Appl. No. 17/654,762, filed Mar. 14, 2022, SanDisk Technologies LLC.

U.S. Appl. No. 17/654,768, filed Mar. 14, 2022, SanDisk Technologies LLC.

U.S. Appl. No. 17/654,773, filed Mar. 14, 2022, SanDisk Technologies LLC.

U.S. Appl. No. 17/654,781, filed Mar. 14, 2022, SanDisk Technologies LLC.

\* cited by examiner

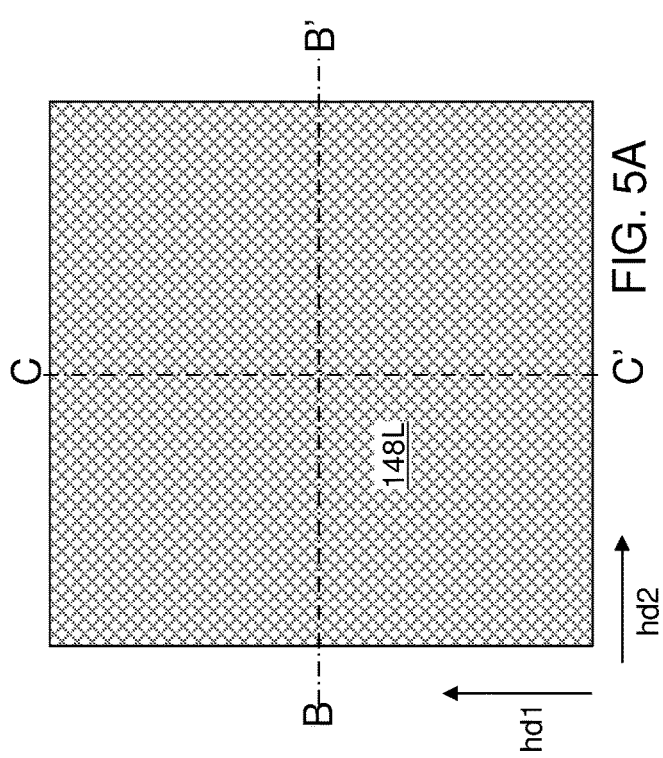
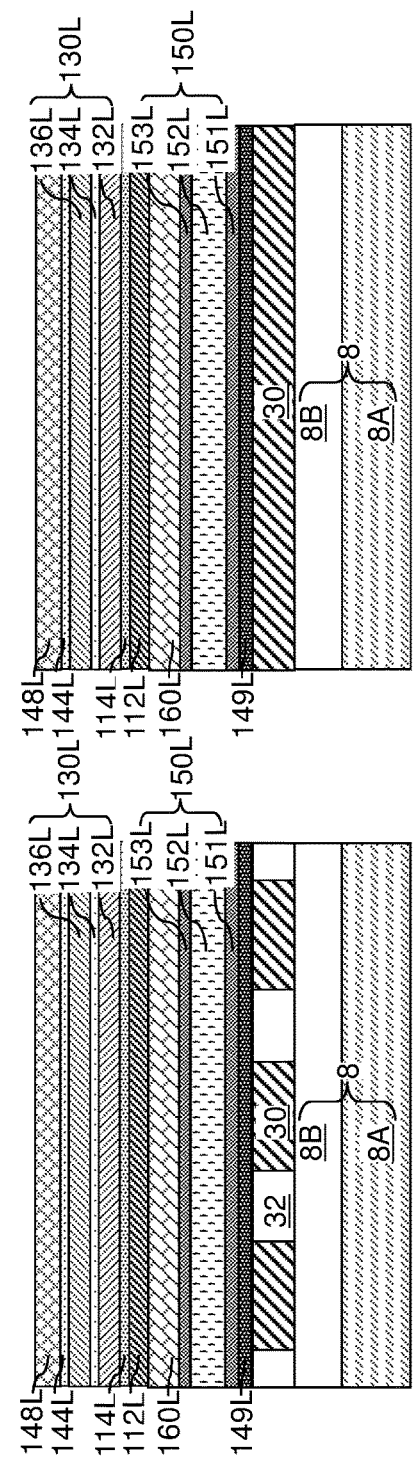
FIG. 5A
FIG. 5B
FIG. 5C

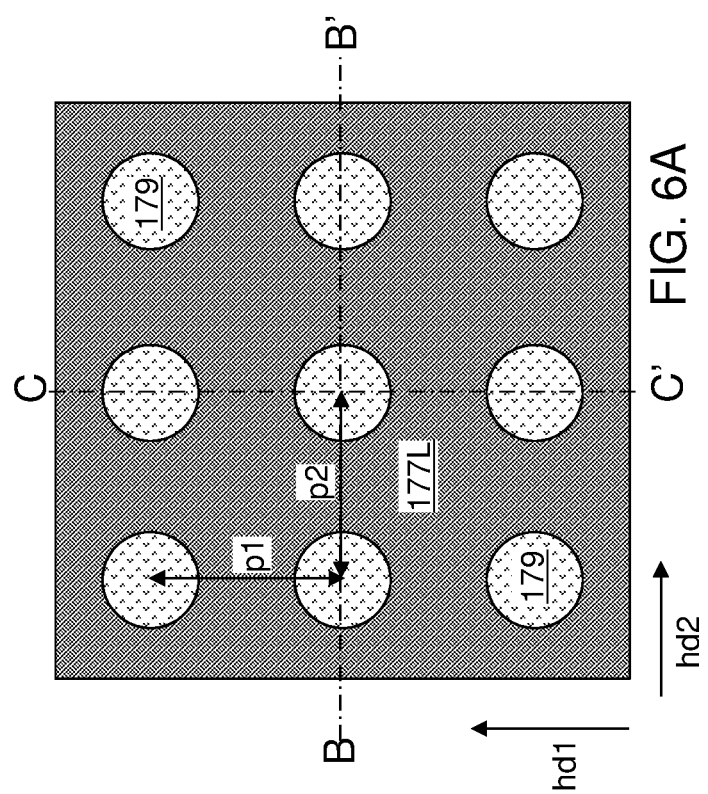

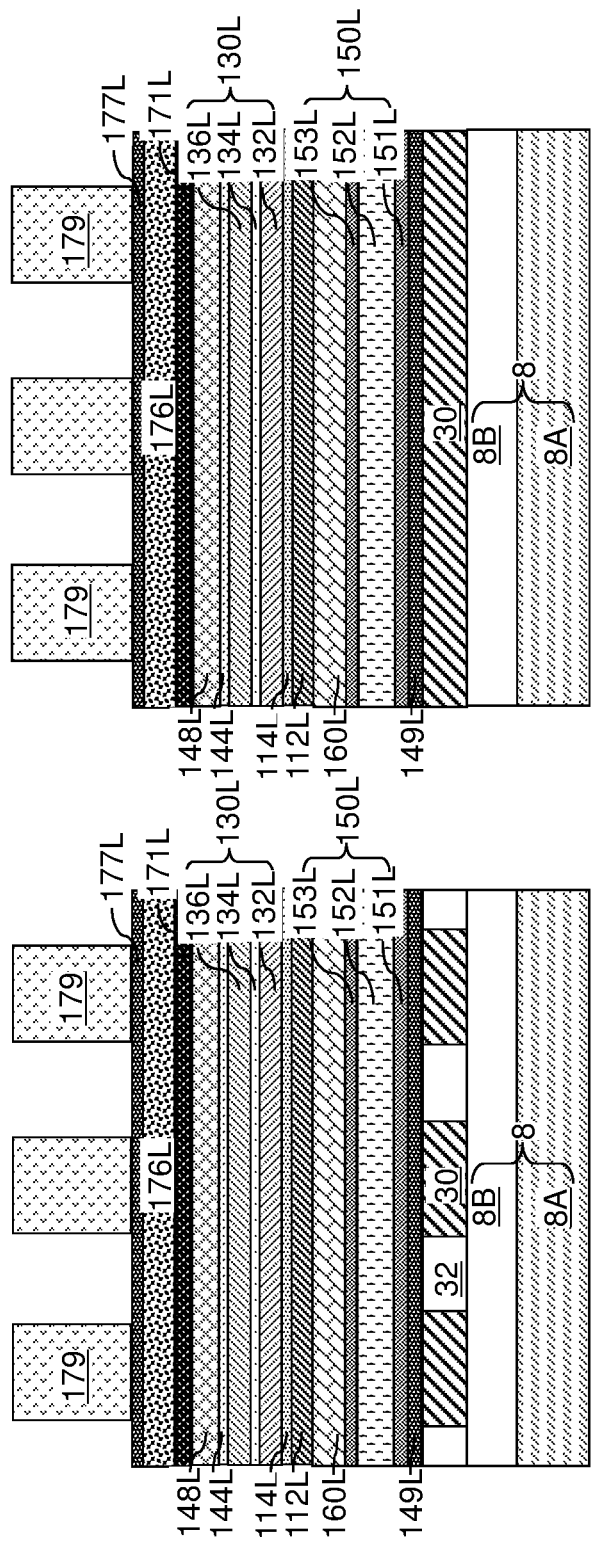

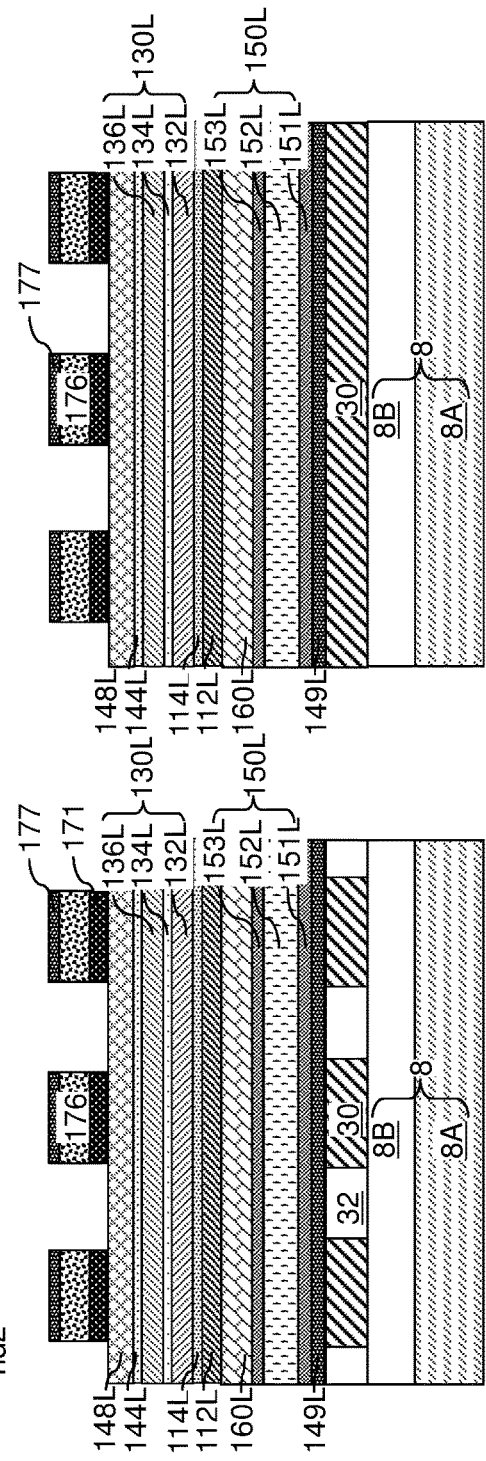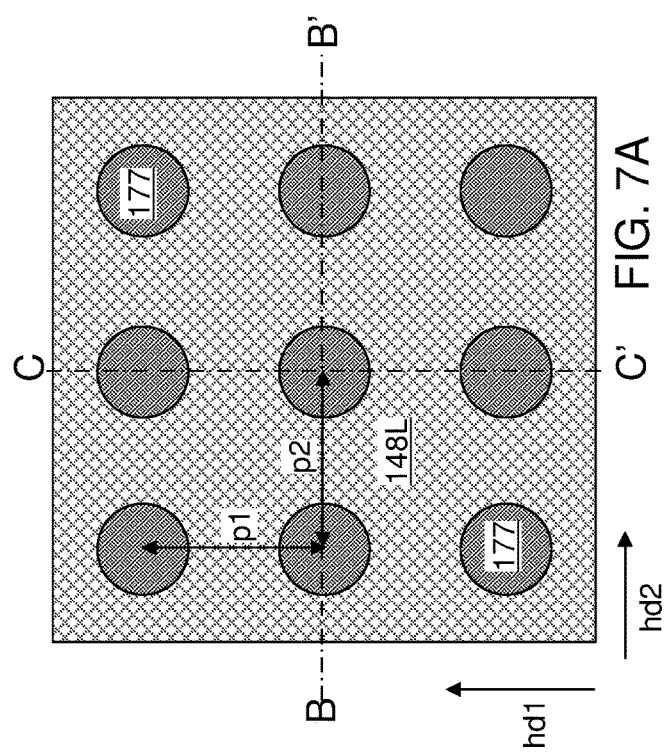

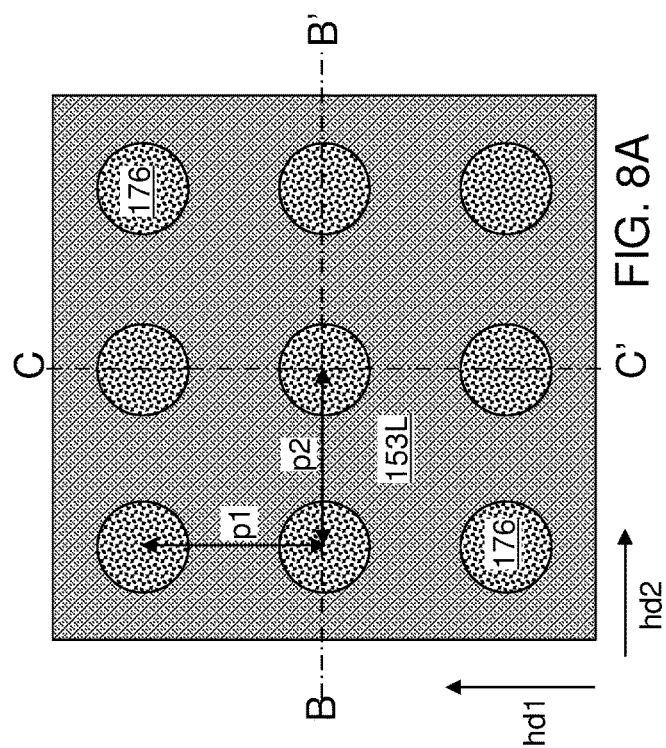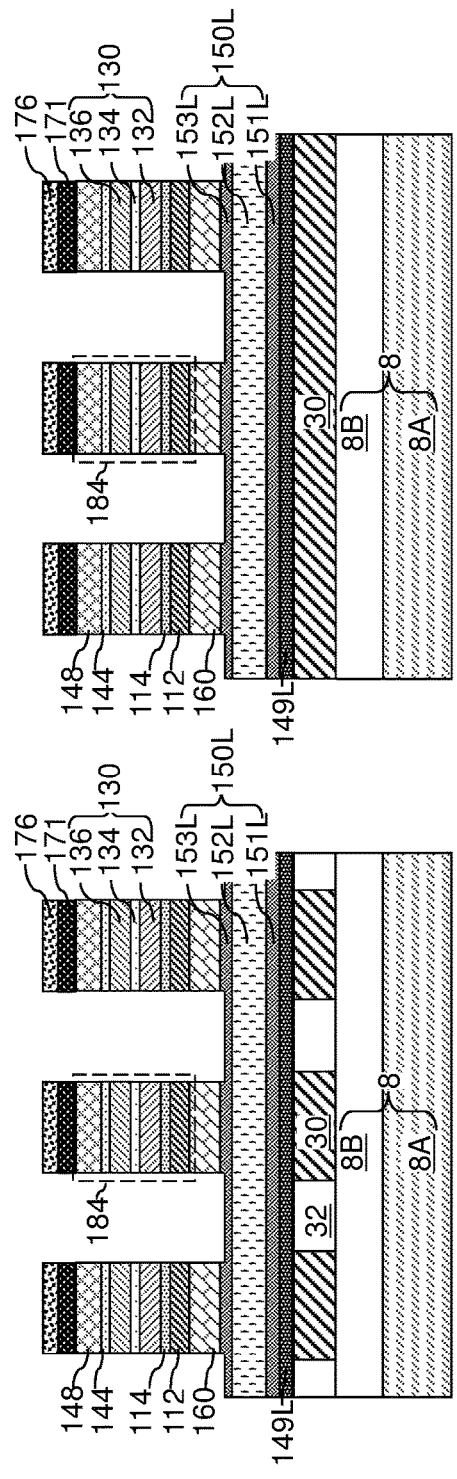

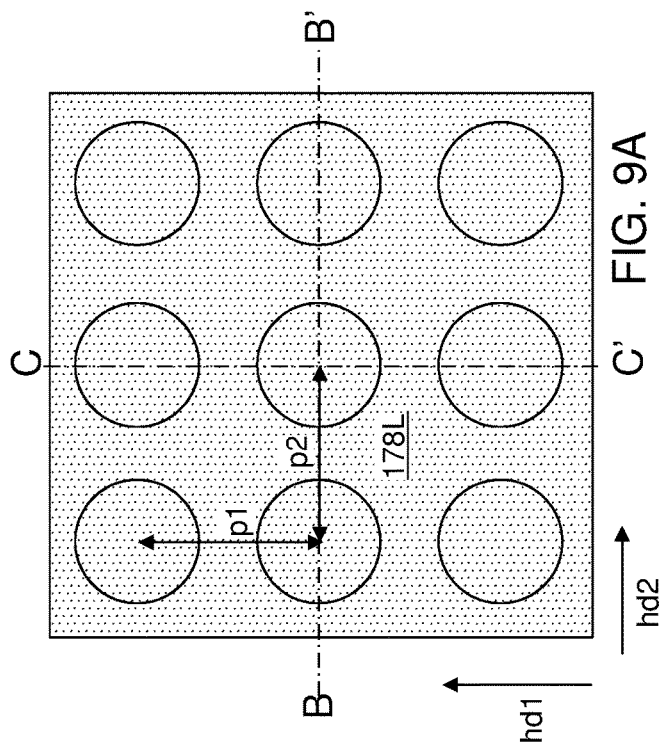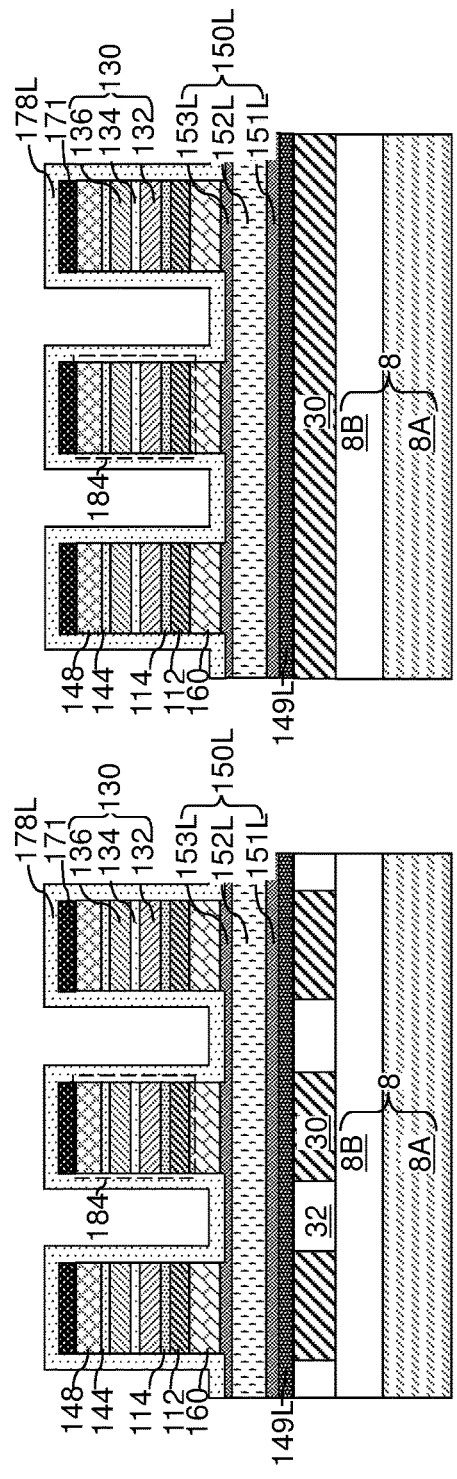
FIG. 9A
FIG. 9B
FIG. 9C

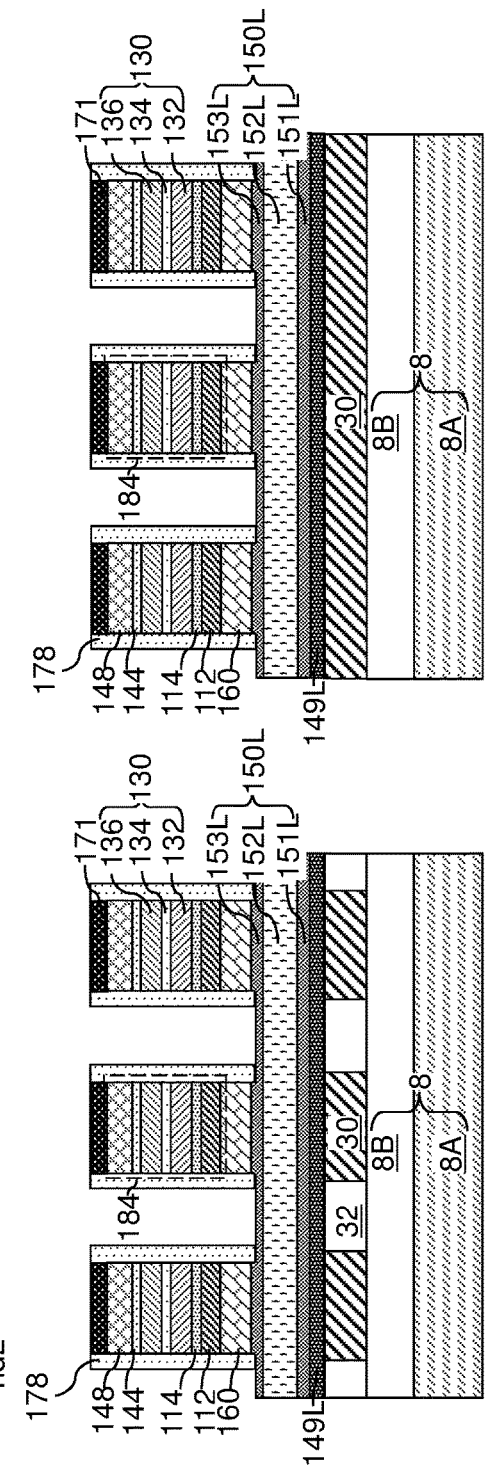
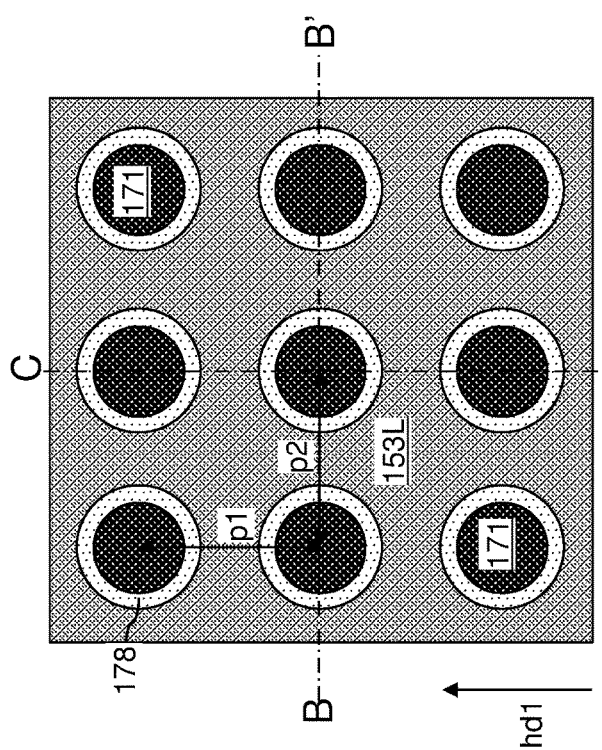
FIG. 10A FIG. 10B FIG. 10C

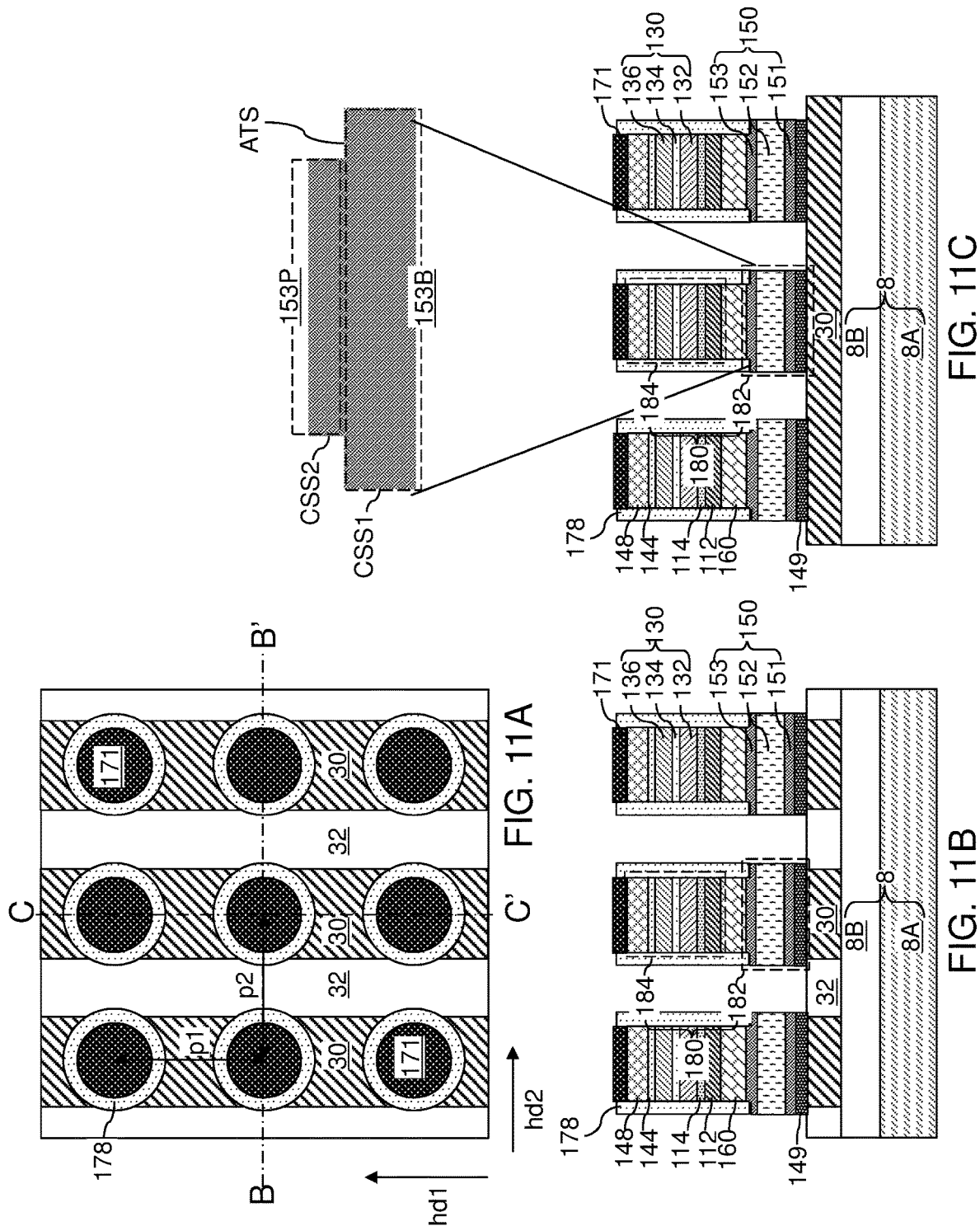

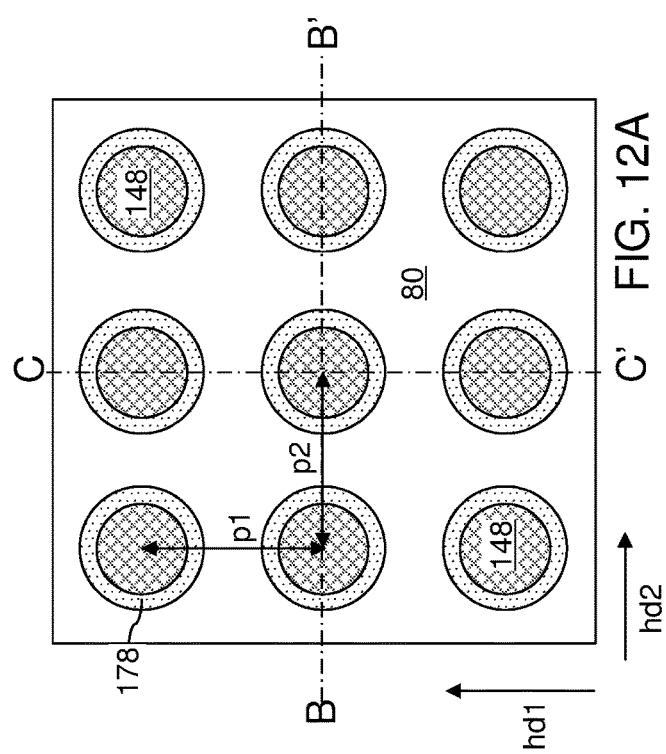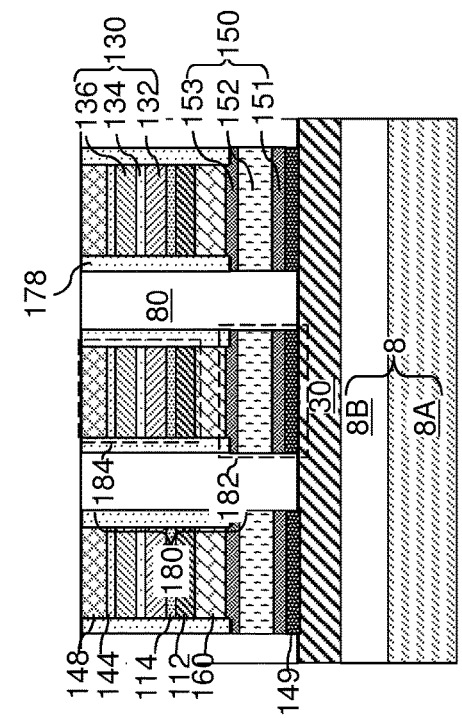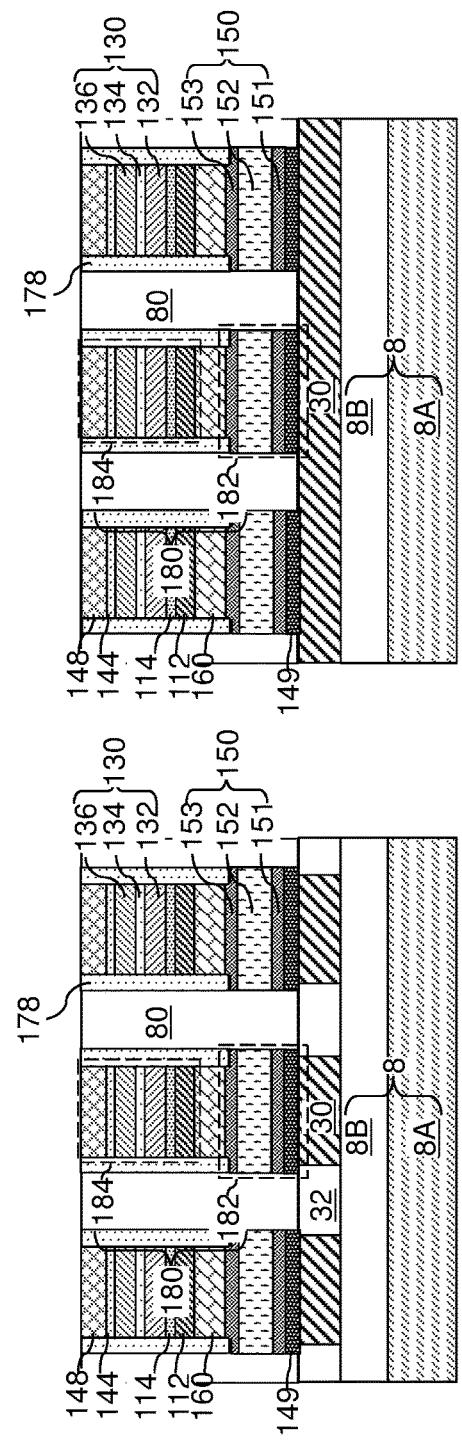

CROSS-POINT MAGNETORESISTIVE MEMORY ARRAY INCLUDING SELF-ALIGNED DIELECTRIC SPACERS AND METHOD OF MAKING THEREOF

FIELD

The present disclosure relates generally to the field of magnetic memory devices, and particularly to a cross-point magnetoresistive memory array including self-aligned dielectric spacers and methods of manufacturing the same.

BACKGROUND

Spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing a torque on the magnetization of the free layer. When a sufficient amount of spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the magnetoresistive random access memory (MRAM) cell depending if the magnetization of the free layer is parallel or antiparallel to the magnetization of the polarizer layer, also known as a reference layer.

SUMMARY

According to an aspect of the present disclosure, a memory array is provided, which comprises: first electrically conductive lines laterally extending along a first horizontal direction and laterally spaced apart from each other along a second horizontal direction; a two-dimensional array of selector-containing pillar structures located over the first electrically conductive lines and including a respective selector element; a two-dimensional array of magnetic tunnel junction (MTJ) pillar structures located over the two-dimensional array of selector-containing pillar structures and including a respective magnetic tunnel junction (MTJ); a two-dimensional array of tubular dielectric spacers laterally surrounding the two-dimensional array of MTJ pillar structures and having a respective outer sidewall having a bottom periphery that coincides with a top periphery of a sidewall of a respective underlying one of the selector-containing pillar structures; and second electrically conductive lines laterally extending along the second horizontal direction and overlying the two-dimensional array of MTJ pillar structures.

According to another aspect of the present disclosure, a method of forming a memory array is provided, which comprises: forming first electrically conductive lines laterally extending along a first horizontal direction and laterally spaced apart from each other along a second horizontal direction; forming selector material layers over the first electrically conductive lines; forming magnetic-tunnel-junction-level (MTJ-level) material layers over the selector material layers; patterning the magnetic-tunnel-junction-level (MTJ-level) material layers into a two-dimensional array of magnetic tunnel junction (MTJ) pillar structures each including a respective magnetic tunnel junction (MTJ); depositing a dielectric spacer material layer over the two-dimensional array of MTJ pillar structures; anisotropically etching the dielectric spacer material layer and the selector material layers, wherein patterned portions of the selector material layers comprise a two-dimensional array of selector-containing pillar structures; and forming second electrically conductive lines laterally extending along the second horizontal direction over the two-dimensional array of MTJ pillar structures.

According to another aspect of the present disclosure, a method of forming a memory array comprises forming first electrically conductive lines laterally extending along a first horizontal direction and laterally spaced apart from each other along a second horizontal direction, forming selector material layers over the first electrically conductive lines, forming magnetic-tunnel-junction-level (MTJ-level) material layers over the selector material layers, patterning the magnetic-tunnel-junction-level (MTJ-level) material layers and at least an upper portion of the selector material layers into a two-dimensional array of magnetic tunnel junction (MTJ) pillar structures each including a respective magnetic tunnel junction (MTJ), wherein patterned portions of the selector material layers comprise a two-dimensional array of selector-containing pillar structures, and forming second electrically conductive lines laterally extending in the second horizontal direction over the two-dimensional array of MTJ pillar structures.

BRIEF DESCRIPTION OF THE DRAWINGS

FIG. 3A is a top-down view, FIG. 3B is a vertical cross-sectional view along the vertical plane B-B' of FIG. 3A, and FIG. 3C is a vertical cross-sectional view along the vertical plane C-C' of FIG. 3A.

FIG. 4A is a top-down view, FIG. 4B is a vertical cross-sectional view along the vertical plane B-B' of FIG. 4A, and FIG. 4C is a vertical cross-sectional view along the vertical plane C-C' of FIG. 4A.

FIGS. 5A-5C are various views of the exemplary structure after formation of magnetic-tunnel-junction-level material layers according to an embodiment of the present disclosure. FIG. 5A is a top-down view, FIG. 5B is a vertical cross-sectional view along the vertical plane B-B' of FIG. 5A, and FIG. 5C is a vertical cross-sectional view along the vertical plane C-C' of FIG. 5A.

FIGS. 6A-6C are various views of the exemplary structure after formation of pattern transfer assist layers and a two-dimensional array of discrete patterned photoresist material portions according to an embodiment of the present disclosure. FIG. 6A is a top-down view, FIG. 6B is a vertical cross-sectional view along the vertical plane B-B' of FIG.

6A, and FIG. 6C is a vertical cross-sectional view along the vertical plane C-C' of FIG. 6A.

FIGS. 7A-7C are various views of the exemplary structure after formation of a two-dimensional array of etch mask material portions according to an embodiment of the present disclosure. FIG. 7A is a top-down view, FIG. 7B is a vertical cross-sectional view along the vertical plane B-B' of FIG. 7A, and FIG. 7C is a vertical cross-sectional view along the vertical plane C-C' of FIG. 7A.

FIGS. 8A-8C are various views of the exemplary structure after formation of a two-dimensional array of magnetic tunnel junction pillar structures according to an embodiment of the present disclosure. FIG. 8A is a top-down view, FIG. 8B is a vertical cross-sectional view along the vertical plane B-B' of FIG. 8A, and FIG. 8C is a vertical cross-sectional view along the vertical plane C-C' of FIG. 8A.

FIGS. 9A-9C are various views of the exemplary structure after formation of a dielectric spacer material layer according to an embodiment of the present disclosure. FIG. 9A is a top-down view, FIG. 9B is a vertical cross-sectional view along the vertical plane B-B' of FIG. 9A, and FIG. 9C is a vertical cross-sectional view along the vertical plane C-C' of FIG. 9A.

FIGS. 10A-10C are various views of the exemplary structure after formation of a two-dimensional array of dielectric spacers according to an embodiment of the present disclosure. FIG. 10A is a top-down view, FIG. 10B is a vertical cross-sectional view along the vertical plane B-B' of FIG. 10A, and FIG. 10C is a vertical cross-sectional view along the vertical plane C-C' of FIG. 10A.

FIGS. 11A-11C are various views of the exemplary structure after formation of a two-dimensional array of selector-containing pillar structures according to an embodiment of the present disclosure. FIG. 11A is a top-down view, FIG. 11B is a vertical cross-sectional view along the vertical plane B-B' of FIG. 11A, and FIG. 11C is a vertical cross-sectional view along the vertical plane C-C' of FIG. 11A.

FIGS. 12A-12C are various views of the exemplary structure after formation of a dielectric matrix layer according to an embodiment of the present disclosure. FIG. 12A is a top-down view, FIG. 12B is a vertical cross-sectional view along the vertical plane B-B' of FIG. 12A, and FIG. 12C is a vertical cross-sectional view along the vertical plane C-C' of FIG. 12A.

FIG. 13A is a top-down view, FIG. 13B is a vertical cross-sectional view along the vertical plane B-B' of FIG. 13A, and FIG. 13C is a vertical cross-sectional view along the vertical plane C-C' of FIG. 13A.

DETAILED DESCRIPTION

Figure 1:
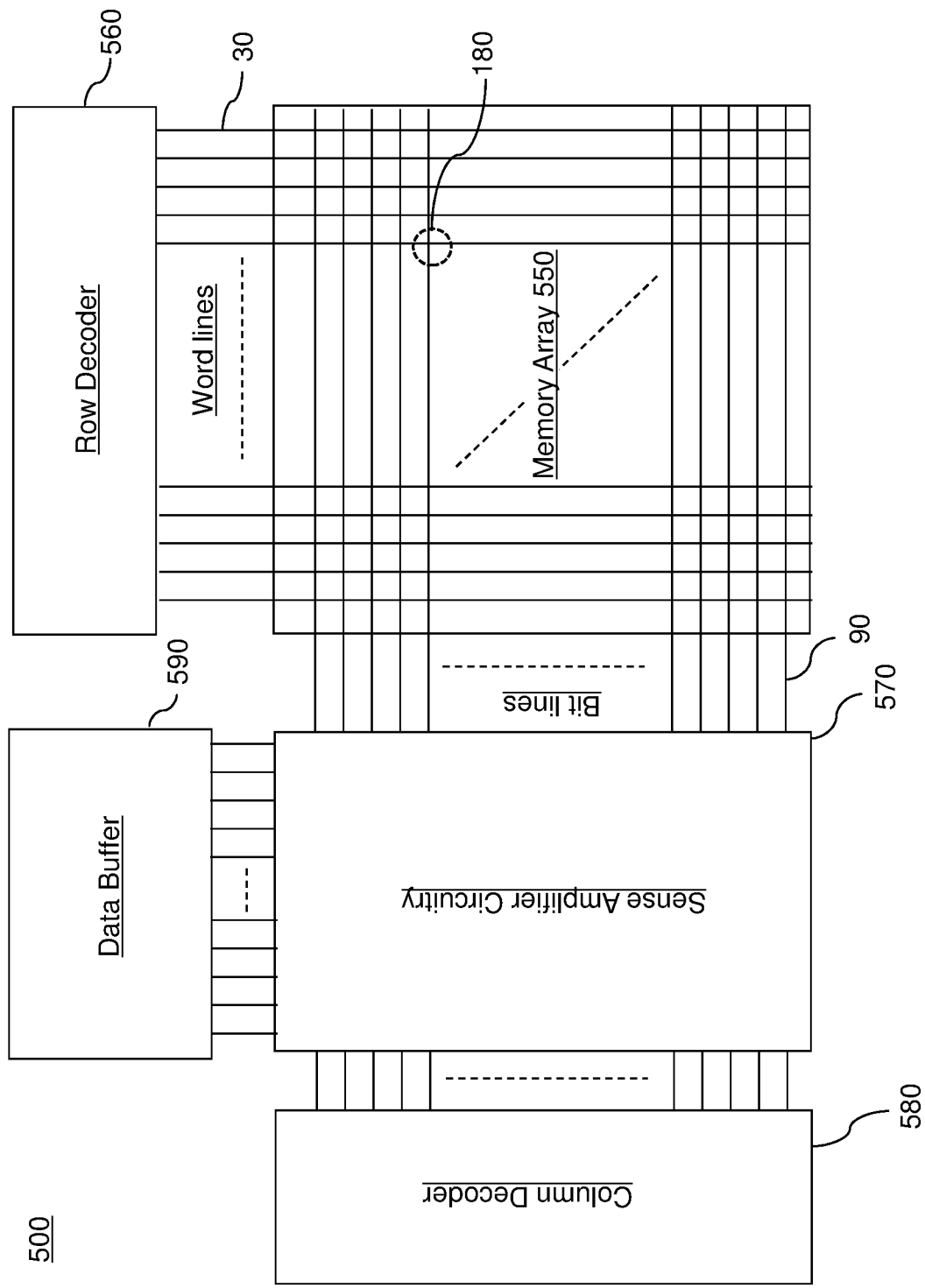
FIG. 1 is a schematic diagram of a memory device including resistive memory cells of the present disclosure in an array configuration.

As discussed above, the present disclosure is directed to a cross-point magnetoresistive memory array including self-aligned dielectric spacers and methods of manufacturing the same, the various aspects of which are discussed herein in detail.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. As used herein, a "metallic material" refers to a conductive material including at least one metallic element therein. All measurements for electrical conductivities are made at the standard condition.

Referring to FIG. 1, a schematic diagram is shown for a magnetic memory device including memory cells 180 of an embodiment of the present disclosure in an array configuration. The magnetic memory device can be configured as a MRAM device 500 containing MRAM cells 180. As used herein, a "RAM device" refers to a memory device containing memory cells that allow random access, e.g., access to any selected memory cell upon a command for reading the contents of the selected memory cell. As used herein, an "MRAM device" refers to a RAM device in which the memory cells are magnetoresistive memory cells.

The MRAM device 500 of an embodiment of the present disclosure includes a memory array region 550 containing an array of the respective MRAM cells 180 located at the intersection of the respective word lines (which may comprise first electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). The MRAM device 500 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the MRAM cells 180 are provided in an array configuration that forms the MRAM device 500. As such, each of the MRAM cells 180 can be a two-terminal device including a respective first electrode and a respective second electrode. It should be noted that the location and interconnection of elements are schematic and the elements may be arranged in a different configuration. Further, a MRAM cell 180 may be manufactured as a discrete device, i.e., a single isolated device.

Each MRAM cell 180 includes a magnetic tunnel junction or a spin valve having at least two different resistive states depending on the alignment of magnetizations of different magnetic material layers. The magnetic tunnel junction or the spin valve is provided between a first electrode and a second electrode within each MRAM cell 180. Configurations of the MRAM cells 180 are described in detail in subsequent sections.

Figure 2:
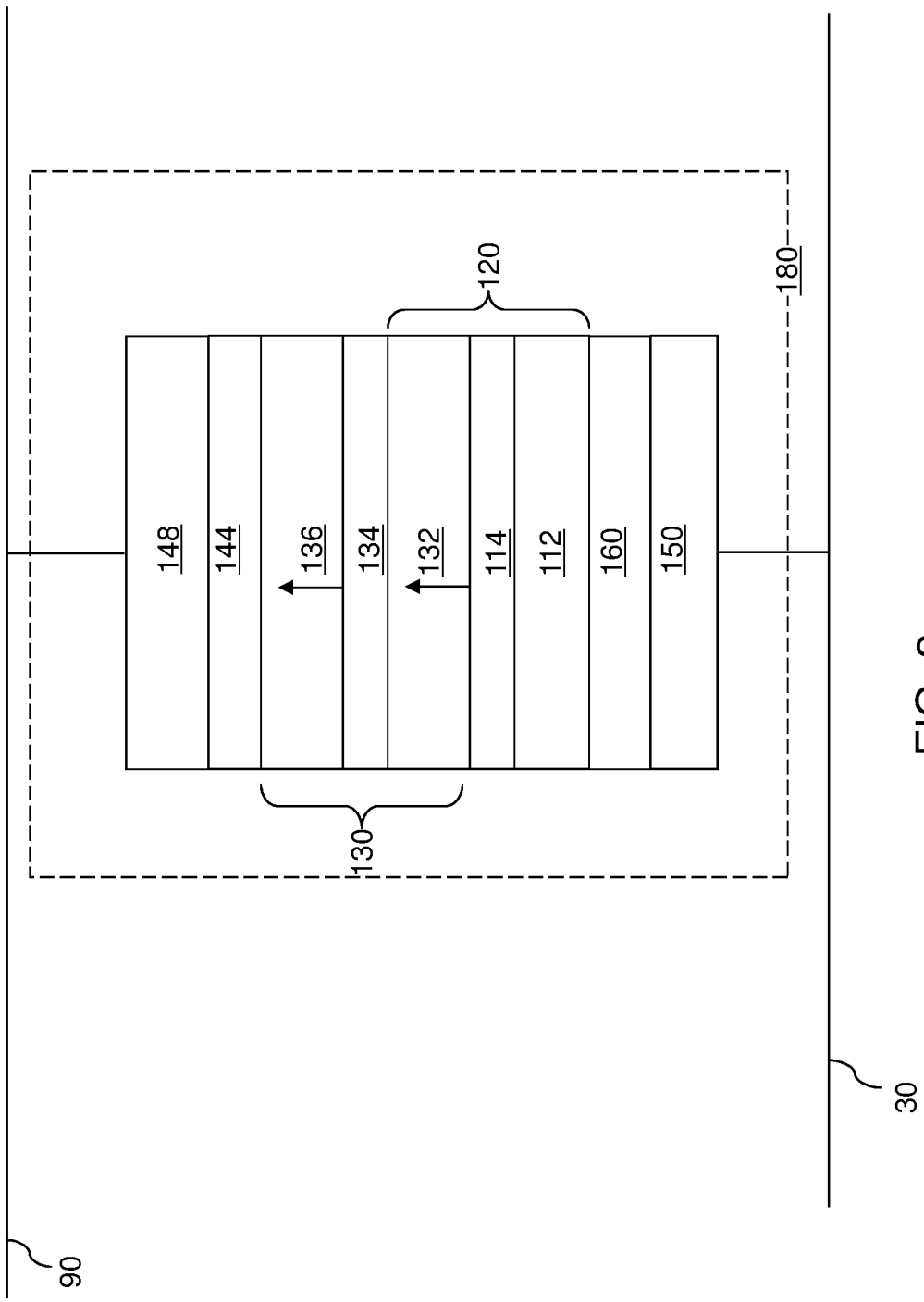
FIG. 2 illustrates an exemplary STT MRAM cell according to an embodiment of the present disclosure.

Referring to FIG. 2, an exemplary spin-transfer torque (STT) MRAM device is illustrated, which may comprise one MRAM cell 180 within the magnetic memory device illustrated in FIG. 1. The MRAM cell 180 of FIG. 2 can include a first terminal that may be electrically connected to, or comprises, a portion of a first electrically conductive line 30 and a second terminal that may be electrically connected to, or comprises, a portion of a second electrically conductive line 90. The first terminal can function as a first electrode, and the second terminal can function as a second electrode.

Generally, the MRAM cell 180 includes a magnetic tunnel junction (MTJ) 130. The magnetic tunnel junction 130 includes a reference layer 132 (which may also be referred to as a "pinned" layer) having a fixed vertical magnetization, a nonmagnetic tunnel barrier layer 134, and the free layer 136 (which may also be referred to as a "storage" layer) having a magnetization direction that can be programmed. The reference layer 132 and the free layer 136 can be separated by the nonmagnetic tunnel barrier layer 134 (which may be a dielectric layer such as an MgO layer), and have a magnetization direction perpendicular to the interface between the free layer 136 and the nonmagnetic tunnel barrier layer 134.

In one embodiment, the reference layer 132 is located below the nonmagnetic tunnel barrier layer 134, while the free layer 136 is located above the nonmagnetic tunnel barrier layer 134. An electrically conductive capping layer 148 may be formed on top of the free layer 136 in order to provide additional perpendicular anisotropy. A dielectric capping layer 144 may be provided between the free layer 136 and the electrically conductive capping layer 148. In one embodiment, the reference layer 132 and the free layer 136 have respective positive uniaxial magnetic anisotropy. Positive uniaxial magnetic anisotropy is also referred to as perpendicular magnetic anisotropy (PMA) in which a minimum energy preference for quiescent magnetization is along the axis perpendicular to the plane of the magnetic film.

The configuration in which the reference layer 132 and the free layer 136 have respective perpendicular magnetic anisotropy provides bistable magnetization states for the free layer 136. The bistable magnetization states include a parallel state in which the free layer 136 has a magnetization (e.g., magnetization direction) that is parallel to the fixed vertical magnetization (e.g., magnetization direction) of the reference layer 132, and an antiparallel state in which the free layer 136 has a magnetization (e.g., magnetization direction) that is antiparallel to the fixed vertical magnetization (e.g., magnetization direction) of the reference layer 132.

A data bit can be written in the STT MRAM cell by passing high enough electrical current through the reference layer 132 and the free layer 136 in a programming operation so that spin-transfer torque can set or reset the magnetization state of the free layer 136. The direction of the magnetization of the free layer 136 after the programming operation depends on the current polarity with respect to magnetization direction of the reference layer 132. The data bit can be read by passing smaller electrical current through the STT MRAM cell and measuring the resistance of the STT MRAM cell. The data bit "0" and the data bit "1" correspond to low and high resistance states of the STT MRAM cell (or vice versa), which are provided by parallel or antiparallel alignment of the magnetization directions of the free layer 136 and the reference layer 132, respectively. The relative resistance change between parallel and antiparallel alignment (i.e., orientation) of the magnetization direction is called tunnel magnetoresistance (TMR).

In one embodiment, the reference layer 132 and the free layer 136 may include one or more ferromagnetic layers, such as CoFe or CoFeB. In plural ferromagnetic layers are included in the reference layer 132, then a thin non-magnetic layer comprised of tantalum or tungsten having a thickness of 0.2 nm~0.5 nm may be located between the ferromagnetic layers. The nonmagnetic tunnel barrier layer 134 can include any tunneling barrier material such as an electrically insulating material, for example magnesium oxide. The thickness of the nonmagnetic tunnel barrier layer 134 can be 0.7 nm to 1.3 nm, such as about 1 nm.

The reference layer 132 may be provided as a component within a synthetic antiferromagnetic structure (SAF structure) 120 which is formed over an optional nonmagnetic metallic seed layer 160, such as a Ta and/or Pt seed layer. In one embodiment, the SAF structure 120 can include a vertical stack including at least one superlattice 112 and an antiferromagnetic coupling layer 114 located between the reference layer 132 and the at least one superlattice 112. In one embodiment, the at least one superlattice 112 may comprise a first superlattice and a second superlattice. The antiferromagnetic layer 114 may comprise an Ir or an IrMn alloy layer located between the first and the second superlattices. In one embodiment, the first superlattice comprises N1 repetitions of a first unit layer stack of the first cobalt layer and the first platinum layer, and a first capping cobalt layer, such that N1 of the first platinum layers are interlaced with (N1+1) of the first cobalt layers, where N1 is an integer in a range from 2 to 10. The second superlattice comprises N2 repetitions of a second unit layer stack of the second cobalt layer and the second platinum layer, and a second capping cobalt layer, such that N2 first platinum layers are interlaced with (N2+1) second cobalt layers, where N2 is an integer in a range from 2 to 10. Other SAF structures 120 may be used. For example, a hard-magnetization layer may be used instead of the at least one superlattice 112. The hard-magnetization layer 112 includes a ferromagnetic material having perpendicular magnetic anisotropy. The magnetization of the reference layer 132 can be antiferromagnetically coupled to the magnetization of the hard-magnetization layer 112.

The electrically conductive capping layer 148, if present, can include a nonmagnetic metal layer or multilayers, such as ruthenium, tungsten and/or tantalum. The electrically conductive capping layer 148 may be a portion of a second electrically conductive line 90, or may be an electrically conductive structure that underlies the second electrically conductive line 90.

In one embodiment, the insulating cap layer 144 may comprise a thin magnesium oxide layer that is thin enough to enable tunneling of electrical current, such as a thickness in a range from 4 Angstroms to 10 Angstroms. In one embodiment, the MRAM cell 180 can be a single tunnel junction device that includes only one magnetic tunnel junction 130.

A selector element 150 can be formed in a series connection with the magnetic tunnel junction 130. The selector element 150 includes a selector material that provides a bidirectional current flow when the current or voltage exceeds a threshold value. Thus, the selector element 150 is a bidirectional selector device which permits bidirectional current flow when the current or voltage exceeds a threshold value and blocks current flow when the current or voltage is below the threshold value. The selector element 150 may include an ovonic threshold switch (OTS) material that allows flow of electrical current only when a voltage differential thereacross exceeds a threshold voltage value. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage. An ovonic threshold switch material can be non-crystalline (for example, by being amorphous) at a non-conductive state, and can remain non-crystalline (for example, by remaining amorphous) at a conductive state, and can revert back to a high resistance state when a high voltage bias thereacross is removed, i.e., when not subjected to a large voltage bias across a layer of the ovonic threshold voltage material. Throughout the resistive state changes, the ovonic threshold switch material can remain amorphous. In one embodiment, the ovonic threshold switch material can comprise a chalcogenide material. The chalcogenide material may be a GeSeAs alloy, a GeSeAsTe alloy, a GeTeAs alloy, a GeSeTe alloy, a GeSe alloy, a SeAs alloy, a AsTe alloy, a GeTe alloy, a SiTe alloy, a SiAsTe alloy, or SiAsSe alloy. The chalcogenide material may be undoped or doped with at least one of N, O, C, P, Ge, As, Te, Se, In, or Si.

The selector element 150 may also include one or more electrically conductive and/or barrier layers, such as tungsten, tungsten nitride, tantalum, tantalum nitride, a carbon-nitrogen layer, etc.). The electrically conductive and/or barrier layers may be located above and/or below the ovonic threshold switch material.

The layer stack including the selector element 150, the SAF structure 120, the magnetic tunnel junction 130, the insulating cap layer 144 and the electrically conductive capping layer 148 can be annealed to induce crystallographic alignment between the crystalline structure of the nonmagnetic tunnel barrier layer 134 (which may include crystalline MgO having a rock salt crystal structure) and the crystalline structure within the free layer 136.

In one embodiment, the reference layer 132 has a fixed vertical magnetization that is perpendicular to an interface between the reference layer 132 and the nonmagnetic tunnel barrier layer 134. The free layer 136 has perpendicular magnetic anisotropy to provide bistable magnetization states that include a parallel state having a magnetization that is parallel to the fixed vertical magnetization and an antiparallel state having a magnetization that is antiparallel to the fixed vertical magnetization. The magnetization direction of the free layer 136 can be flipped (i.e., from upward to downward or vice versa) by flowing electrical current through the discrete patterned layer stack (120, 130, 144, 148, 150, 170).

Figure 3A:
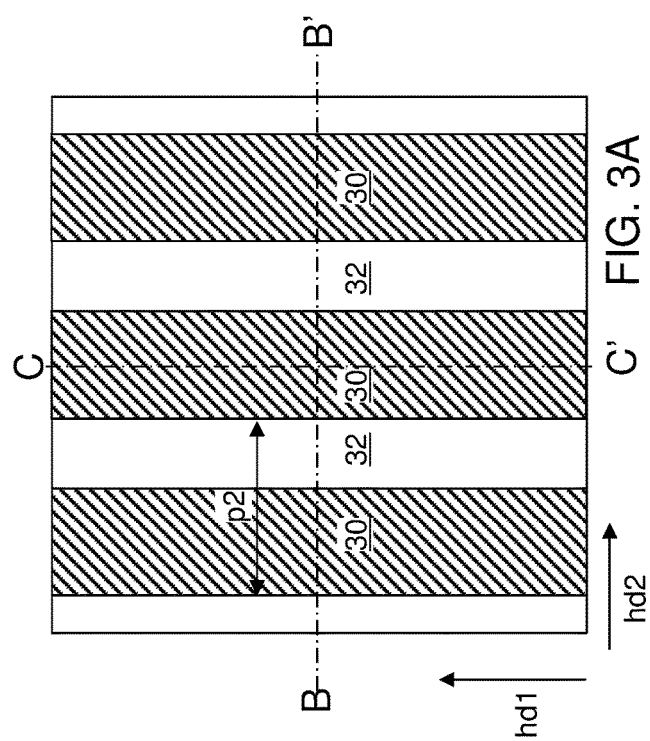
FIGS. 3A-3C are various views of an exemplary structure after formation of first electrically conductive lines according to an embodiment of the present disclosure.
Figure 3C:
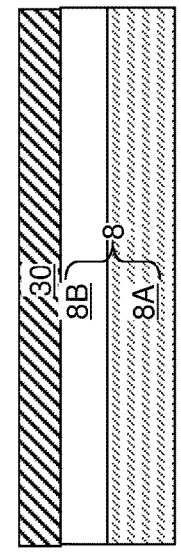
Figure 3B:
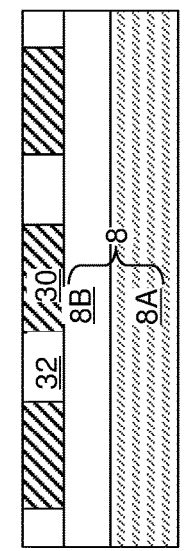

Referring to FIGS. 3A and 3B, an exemplary structure for forming a two-dimensional array of STT MRAM cells 180 is illustrated. The exemplary structure can be provided by forming a layer stack of blanket (unpatterned) layers over a substrate 8. The substrate 8 may comprise, for example, a semiconductor substrate 8A and at least one dielectric material layer 8B formed over the semiconductor substrate 8A. Alternatively, an insulating substrate 8 (e.g., a ceramic or a glass substrate) or a conductive substrate 8 (e.g., a metal or metal alloy substrate) may be used instead. In one embodiment, various semiconductor devices (not shown) including switching devices and peripheral (i.e., driver) circuits may be formed over the semiconductor substrate 8A, and metal interconnect structures (not shown) may be formed in the at least one dielectric material layer 8B. The various semiconductor devices, if present, may comprise the various driver circuits of the MRAM device 500 illustrated in FIG. 1 other than the memory array region 550, which is subsequently formed in subsequent processing steps.

A first line-level dielectric layer 32 can be deposited over the substrate 8, and line trenches laterally extending along the first horizontal direction hd1 can be formed through the first line-level dielectric layer 32. A conductive material can be deposited in the line trenches, and excess portions of the conductive material can be removed from above the horizontal plane including the top surface of the first line-level dielectric layer 32. Remaining portions of the conductive material filling the line trenches constitute first electrically conductive lines 30. The first electrically conductive lines 30 comprise, and/or consist essentially of, a nonmagnetic electrically conductive material such as Al, Cu, W, Ru, Mo, Nb, Ti, Ta, TiN, TaN, WN, MoN, or combinations thereof. The thickness of the first electrically conductive lines 30 can be in a range from 20 nm to 100 nm, although lesser and greater thicknesses can also be employed. The first electrically conductive lines 30 laterally extend along the first horizontal direction hd1, and may be laterally spaced apart among one another along a second horizontal direction hd2. The first electrically conductive lines 30 may be formed as a one-dimensional periodic array of first electrically conductive lines 30 having a second pitch p2 along the second horizontal direction hd2. The second pitch p2 may be in a range from 10 nm to 300 nm, although lesser and greater dimensions may also be employed. In one embodiment, the remaining portions of the first line-level dielectric layer 32 may comprise first dielectric rails laterally extending along the first horizontal direction hd1, and interlaced with the first electrically conductive lines 30 along the second horizontal direction hd2. Alternatively, instead of using the above-described damascene process to form the first electrically conductive lines 30, these lines may be formed by a pattern and etch process. In the pattern and etch process, a continuous electrically conductive layer is patterned into the first electrically conductive lines 30 by photolithography and etching. The first line-level dielectric layer 32 is then deposited between the first electrically conductive lines 30 and optionally planarized with the top surfaces of the first electrically conductive lines 30.

Figure 4A:
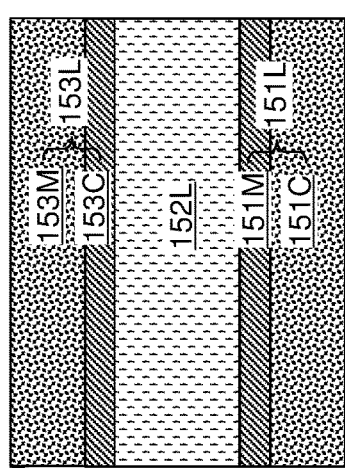
FIGS. 4A-4C are various views of the exemplary structure after formation of selector-level material layers according to an embodiment of the present disclosure.
Figure 4B:
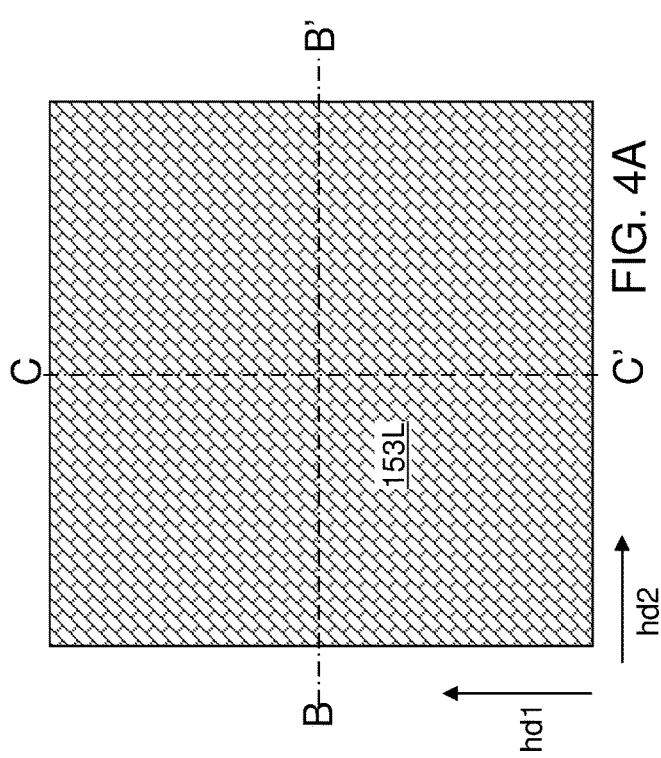
Figure 4C:
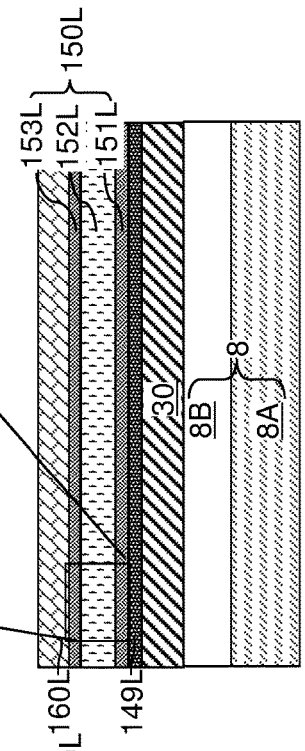

Referring to FIGS. 4A-4C, an optional metallic adhesion layer 149L and selector-level material layers (150L, 160L) can be formed over the first electrically conductive lines 30. The optional metallic adhesion layer 149L comprises a metallic material that promotes adhesion of the selector-level material layers (150L, 160L). For example, the optional metallic adhesion material layer 149L may comprise a metallic material, such as Ta, Ti, TaN, TiN, or WN. The thickness of the metallic adhesion material layer 149L may be in a range from 1 nm to 30 nm, although lesser and greater thicknesses may also be employed.

The selector-level material layers (150L, 160L) can include, from bottom to top, selector material layers 150L and an optional conductive material layer (e.g., seed layer) 160L. The selector material layers 150L can comprise, from bottom to top, a lower selector electrode material layer 151L, a non-Ohmic material layer 152L, and an upper selector electrode material layer 153L. The lower selector electrode material layer 151L includes at least one material that may be employed for lower selector electrodes to be subsequently formed. The non-Ohmic material layer 152L includes a selector material that exhibits a non-Ohmic switching behavior. The upper selector electrode material layer 153L includes at least one material that may be employed upper selector electrodes to be subsequently formed.

In one embodiment, the lower selector electrode material layer 151L may comprise a layer stack including a lower carbon-based electrode material layer 151C and a lower metallic material layer 151M formed on the lower carbon-based electrode material layer 151C. In one embodiment, the upper selector electrode material layer 153L may comprise a layer stack including an upper metallic material layer 153M and an upper carbon-based electrode material layer 153C formed on the upper metallic material layer 153M.

The lower carbon-based electrode material layer 151C and the upper carbon-based electrode material layer 153C within the selector-level material layers can include a respective carbon-based conductive material including carbon atoms at an atomic concentration greater than 50%. In one embodiment, the lower carbon-based electrode material layer 151C and the upper carbon-based electrode material layer 153C may include carbon atoms at an atomic concentration in a range from 50% to 100%, such as from 70% to 100% and/or from 80% to 100%. In one embodiment, each of lower carbon-based electrode material layer 151C and the upper carbon-based electrode material layer 153C comprises a respective material selected from diamond-like carbon (DLC), a carbon nitride material, and a carbon-rich conductive compound of carbon atoms and non-carbon atoms. Each of the lower carbon-based electrode material layer 151C and the upper carbon-based electrode material layer 153C may have a respective thickness in a range from 3 nm to 300 nm, although lesser and greater thicknesses may also be employed.

The lower metallic material layer 151M and the upper metallic material layer 153M within the selector material layers 150L can include a respective metallic material having electrical conductivity that is greater than the electrical conductivity of the carbon-based conductive materials of the lower carbon-based electrode material layer 151C and the upper carbon-based electrode material layer 153C. In one embodiment, the lower metallic material layer 151M comprises a metallic material having electrical conductivity that is at least 10 times (which may be at least 30 times and/or at least 100 times and/or at least 1,000 times) the electrical conductivity of the carbon-based conductive material of lower carbon-based electrode material layer 151C, and the upper metallic material layer 153M comprises a second metallic material having electrical conductivity that is at least 10 times (which may be at least 30 times and/or at least 100 times and/or at least 1,000 times) the electrical conductivity of the carbon-based conductive material of the upper carbon-based electrode material layer 153C.

Generally, each of the lower metallic material layer 151M and the upper metallic material layer 153M may comprise, and/or may consist essentially of, a high-conductivity metallic material that has a high electrical conductivity, and thus, is capable of functioning as a current-spreading material that prevents concentration of electrical current in the non-Ohmic material of the non-Ohmic material layer 152L. In one embodiment, the lower metallic material layer 151M and/or the upper metallic material layer 153M may comprise, and/or may consist essentially of, an elemental metal, a conductive metallic carbide, or a conductive metallic nitride. In one embodiment, the lower metallic material layer 151M and/or the upper metallic material layer 153M may comprise, and/or may consist essentially of, a respective elemental metal having a melting point higher than 2,000 degrees Celsius (such as refractory metals). In one embodiment, the lower metallic material layer 151M and/or the upper metallic material layer 153M may comprise, and/or may consist essentially of, a respective elemental metal selected from ruthenium, niobium, molybdenum, tantalum, tungsten, or rhenium. In one embodiment, the lower metallic material layer 151M and/or the upper metallic material layer 153M may comprise, and/or may consist essentially of, a conductive metallic carbide such as tungsten carbide. In one embodiment, the lower metallic material layer 151M and/or the upper metallic material layer 153M may comprise, and/or may consist essentially of, a conductive metallic nitride such as tungsten nitride, titanium nitride, or tantalum nitride.

Generally, the lower metallic material layer 151M and the upper metallic material layer 153M may have a lower thickness than the lower carbon-based electrode material layer 151C and the upper carbon-based electrode material layer 153C. Each of the lower metallic material layer 151M and the upper metallic material layer 153M may have a respective thickness in a range from 0.2 nm to 10 nm, such as from 1 nm to 5 nm, although lesser and greater thicknesses may also be employed. In one embodiment, the ratio of the thickness of the lower carbon-based electrode material layer 151C to the thickness of the lower metallic material layer 151M may be in a range from 3.0 to 500, such as from 10 to 100, although lesser and greater ratios may also be employed. In one embodiment, the ratio of the thickness of the upper carbon-based electrode material layer 153C to the thickness of the upper metallic material layer 153M may be in a range from 3.0 to 500, such as from 10 to 100, although lesser and greater ratios may also be employed.

In one embodiment, the non-Ohmic material layer 152L within the selector material layers 150L can include any suitable non-Ohmic selector material which exhibits non-linear electrical behavior. For example, the non-Ohmic selector material may comprise an ovonic threshold switch (OTS) material. As used herein, an ovonic threshold switch material refers to a material that displays a non-linear resistivity curve under an applied external bias voltage such that the resistivity of the material decreases with the magnitude of the applied external bias voltage. In other words, the ovonic threshold switch material is non-Ohmic, and becomes more conductive under a higher external bias voltage than under a lower external bias voltage. As used herein, an ovonic threshold switch is a device that includes a chalcogen-containing ovonic threshold switch material layer which does not crystallize in a low resistivity state under a voltage above the threshold voltage, and reverts back to a high resistivity state when not subjected to a voltage above a critical holding voltage across the ovonic threshold switch material layer.

In another embodiment, the non-Ohmic selector material may comprise a volatile conductive bridge material or at least one non-threshold switch material, such as a tunneling selector material or diode materials (e.g., materials for p-n semiconductor diode, p-i-n semiconductor diode, Schottky diode or metal-insulator-metal diode). Thus, the material layer 152L may comprise a diode layer stack, such as a layer stack of p-doped semiconductor material layer and an n-doped semiconductor material layer, or a layer stack of a p-doped semiconductor material layer, an intrinsic semiconductor material layer, and an n-doped semiconductor material layer.

An ovonic threshold switch material (OTS material) can be non-crystalline (for example, amorphous) in a high resistivity state, and can remain non-crystalline (for example, remain amorphous) in a low resistivity state during application of a voltage above its threshold voltage across the OTS material. The ovonic threshold switch material can revert back to the high resistivity state when the high voltage above its threshold voltage is lowered below a critical holding voltage. Throughout the resistivity state changes, the ovonic threshold switch material can remain non-crystalline (e.g., amorphous). In one embodiment, the ovonic threshold switch material can comprise an amorphous chalcogenide material, such as a GeSeAs alloy, a GeSeAsTe alloy, a GeTeAs alloy, a GeSeTe alloy, a GeSe alloy, a SeAs alloy, a AsTe alloy, a GeTe alloy, a SiTe alloy, a SiAsTe alloy, or SiAsSe alloy. The chalcogenide material may be undoped or doped with at least one of N, O, C, P, Ge, As, Te, Se, In, or Si. The thickness of the non-Ohmic material layer 152L can be, for example, in a range from 1 nm to 50 nm, such as from 5 nm to 25 nm, although lesser and greater thicknesses can also be employed.

The optional conductive material layer 160L includes a nonmagnetic conductive material, such as Ta and/or Pt, which can function as a seed layer for the magnetic-tunnel-junction-level (MTJ-level) material layers to be formed thereon. The thickness of the electrically conductive layer 160L can be in a range from 1 nm to 10 nm, although lesser and greater thicknesses can also be employed. Alternatively, the electrically conductive layer 160L may be omitted.

Referring to FIGS. 5A-5C, the magnetic-tunnel-junction-level (MTJ-level) material layers (112L, 114L, 130L, 144L, 148L) can be formed over the selector-level material layer (150L, 160L). As used herein, "magnetic-tunnel-junction-level material layers" refer to material layers that are formed, or are located, at or about, the level in which magnetic tunnel junctions are formed or located. The MTJ-level material layers may comprise, for example, a continuous superlattice layer 112L, an optional continuous antiferromagnetic coupling layer 114L, continuous magnetic tunnel junction (MTJ) material layers 130L, a continuous dielectric capping layer 144L, and a continuous metallic capping layer 148L. The MTJ material layers 130L may comprises a layer stack including a continuous reference layer 132L, a continuous nonmagnetic tunnel barrier layer 134L, a continuous free layer 136L.

The continuous superlattice layer 112L can have the same material composition and the same thickness as the superlattice layer 112 described with reference to FIG. 2.

The continuous antiferromagnetic coupling layer 114L, if present, can have the same material composition as the antiferromagnetic coupling layer 114 described with reference to FIG. 2. In one embodiment, the continuous antiferromagnetic coupling layer 114 may comprise ruthenium, iridium, or IrMn alloy, and may have thickness in a range from 0.1 nm to 1.0 nm, such as from 0.2 nm to 0.6 nm.

The continuous reference layer 132L can have the same material composition as the reference layer 132 described with reference to FIG. 2. In ne embodiment, the continuous reference layer 132L can include a CoFe alloy or a CoFeB alloy. Optionally, the continuous reference layer 132L may additionally include a thin non-magnetic layer comprised of tantalum or tungsten having a thickness of 0.2 nm~0.5 nm and a thin CoFeB layer having a thickness in a range from 0.5 nm to 3 nm.

The continuous nonmagnetic tunnel barrier layer 134L includes any insulating tunnel barrier material, such as magnesium oxide. The thickness of the continuous nonmagnetic tunnel barrier layer 134L can be 0.7 nm to 1.3 nm, such as about 1 nm.

The continuous free layer 136L can have the same material composition and the same thickness as the free layer 136 described with reference to FIG. 2. In one embodiment, the continuous free layer 136L can include a CoFe alloy or a CoFeB alloy. Optionally, the continuous free layer 136L may additionally include a thin non-magnetic layer comprised of tantalum or tungsten having a thickness of 0.2 nm~0.5 nm and a thin CoFeB layer having a thickness in a range from 0.5 nm to 3 nm.

The continuous dielectric capping layer 144L can have the same material composition as the dielectric capping layer 144 described with reference to FIG. 2. The continuous dielectric capping layer 144L may comprise a thin magnesium oxide layer that is thin enough to enable tunneling of electrical current, such as a thickness in a range from 0.4 nm to 1.0 nm.

The continuous metallic capping layer 148L can have the same material composition as the metallic capping layer 144 described with reference to FIG. 2. The continuous metallic capping layer 148L may comprise a non-magnetic, electrically conductive material, such as W, Ti, Ta, WN, TiN, TaN, Ru, and Cu. The thickness of the continuous metallic capping layer 148L can be in a range from 10 nm to 100 nm, although lesser and greater thicknesses can also be employed.

Referring to FIGS. 6A-6C, an optional first image transfer assist layer 171L, an optional patterning film 176L and/or an optional second image transfer assist layer 177L can be formed over the MTJ-level material layers (112L, 114L, 130L, 144L, 148L).

The optional first image transfer assist layer 171L includes a material that can provide a high etch resistance for an anisotropic etch process to be subsequently employed with respect to the material of the continuous metallic capping layer 148L, thereby providing a high etch selectivity for the etch process that patterns the underlying layers. For example, the optional first image transfer assist layer 171L may comprise a metal such as TiN, TaN, WN, Ti, Ta, W, Cr, Pt, or Ru. For example, the first image transfer assist layer 171L may comprise a bilayer comprising a lower TiN sublayer and an upper Ru or Pt protective sublayer. The thickness of the first image transfer assist layer 171L may be in a range from 1 nm to 30 nm, such as from 2 nm to 10 nm, although lesser and greater thicknesses may also be employed.

The optional patterning film 176L comprises a carbon-based material that can enhance pattern fidelity during subsequent anisotropic etch processes. For example, the optional patterning film 176L may be composed primarily of amorphous carbon or diamond-like carbon.

The optional second image transfer assist layer 177L, if present, includes a material that can provide a high etch resistance for an anisotropic etch process to be subsequently employed with respect to the material of the patterning film 176L. For example, the optional second image transfer assist layer 177L may comprise a metal, such as Cr or Ru. The thickness of the second image transfer assist layer 177L may be in a range from 1 nm to 30 nm, such as from 2 nm to 10 nm, although lesser and greater thicknesses may also be employed.

A photoresist layer can be deposited over the second image transfer assist layer 177L, and can be lithographically patterned to form a two-dimensional array of discrete patterned photoresist material portions 179.

A two-dimensional array of discrete patterned photoresist material portions 179 can be formed over the MTJ-level material layers (112L, 114L, 130L, 144L, 148L), the optional first image transfer assist layer 171L, the optional patterning film 176L, and the optional second image transfer assist layer 177L. The two-dimensional array of discrete patterned photoresist material portions 179 can be formed as a periodic array having a first pitch p1 along the first horizontal direction hd1 and having the second pitch p2 along the second horizontal direction hd2. Each of the first pitch p1 and the second pitch p2 may be independently in a range from 10 nm to 300 nm, although lesser and greater dimensions may also be employed. Each of the first discrete patterned photoresist material portions 179 may have a respective horizontal cross-sectional shape of a rectangle, a rounded rectangle, an oval, or a circle.

Referring to FIGS. 7A-7C, a pattern transfer process, such as an anisotropic etch process may be performed to transfer the pattern of the two-dimensional array of patterned photoresist material portions 179 through the image transfer assist layers (177L, 176L, 171L), which may include a layer stack including the optional first image transfer assist layer 171L, the optional patterning film 176L and/or the optional second image transfer assist layer 177L. A two-dimensional array of etch mask material portions (171, 176, 177) can be formed. In one embodiment, each etch mask material portion (171, 176, 177) may comprise a layer stack including an optional first etch mask plate 171, an optional patterning film plate 176, and an optional second etch mask plate 177. Each first etch mask plate 171 is a patterned portion of the first image transfer assist layer 171L. Each patterning film plate 176 is a patterned portion of the patterning film 176L. Each second etch mask plate 177 is a patterned portion of the second image transfer assist layer 177L. Generally, a two-dimensional array of discrete etch mask material portions (171, 176, 177) can be formed over the MTJ-level material layers (112L, 114L, 130L, 144L, 148L) that include the magnetic tunnel junction material layers 130L. The two-dimensional array of discrete etch mask material portions (171, 176, 177) may be a two-dimensional periodic array having the first pitch p1 along the first horizontal direction hd1 and having the second pitch p2 along the second horizontal direction hd2. The two-dimensional array of discrete patterned photoresist material portions 179 may be consumed during patterning of the two-dimensional array of discrete etch mask material portions (171, 176, 177), or may be removed after patterning of the two-dimensional array of discrete etch mask material portions (171, 176, 177), for example, by ashing.

Referring to FIGS. 8A-8C, an anisotropic etch process can be performed to etch unmasked portions of the MTJ-level material layers (112L, 114L, 130L, 144L, 148L) and the conductive material layer 160L employing the two-dimensional array of discrete etch mask material portions (171, 176, 177) as an etch mask. One of the selector material layers 150L, such as the upper selector electrode material layer 153L, may be employed as an etch stop layer.

In one embodiment, the anisotropic etch process may comprise an ion beam etch (IBE) process, which is also referred to as an ion milling process. In one embodiment, the ion beam etch process may employ a beam of ionized argon atoms. Each patterned portion of the MTJ-level material layers (112L, 114L, 130L, 144L, 148L) comprises a magnetic tunnel junction (MTJ) pillar structure 184. The patterned portions of the MTJ-level material layers (112L, 114L, 130L, 144L, 148L) may comprise a two-dimensional array of magnetic tunnel junction (MTJ) pillar structures 184. Each MTJ pillar structure 184 comprises a stack of an optional seed (i.e., first conductive) layer 160, an optional superlattice layer 112, an optional antiferromagnetic coupling layer 114, a magnetic tunnel junction 130, an optional dielectric capping layer 144, and an optional metallic capping layer 148. The magnetic tunnel junction 130 includes a reference layer 132, a tunnel barrier layer 134, and a free layer 136.

Each seed layer 160 is a patterned portion of the first conductive layer 160L. Each superlattice layer 112 is a patterned portion of the continuous superlattice layer 112L. Each antiferromagnetic coupling layer 114 is a patterned portion of the continuous antiferromagnetic coupling layer 114L. Each magnetic tunnel junction 130 is a patterned portion of the magnetic tunnel junction material layers 130L. Each dielectric capping layer 144 is a patterned portion of the continuous dielectric capping layer 144L. Each metallic capping layer 148 is a patterned portion of the continuous metallic capping layer 148L. Each reference layer 132 is a patterned portion of the continuous reference layer 132L. Each tunnel barrier layer 134 is a patterned portion of the continuous tunnel barrier layer 134L. Each free layer 136 is a patterned portion of the continuous free layer 136L. Sidewalls of each component within an MTJ pillar structure 184 may be vertical, or may be tapered. In one embodiment, a bottom periphery of a sidewall of an overlying component within an MTJ pillar structure 184 may be coincident with a top periphery of a sidewall of an underlying component within the MTJ pillar structure 184 that contacts a bottom surface of the overlying component. In one embodiment, each MTJ pillar structure 184 may have a horizontal cross-sectional shape of a circle, a square, or a rounded square, i.e., a shape that is derived from a square by rounding the four corners.

In one embodiment, the two-dimensional array of MTJ pillar structures 184 has the first pitch p 1 along the first horizontal direction hd1, and has the second pitch p2 along the second horizontal direction hd2.

In one embodiment, unmasked portions of at least one layer of the selector material layers 150L, such as the upper selector electrode material layer 153L, may be vertically recessed. For example, the upper selector electrode material layer 153L may have a recessed surface that is formed below the horizontal plane including topmost horizontal surface segments of the upper selector material layer 153L that contacts seed layers 160.

Generally, the magnetic-tunnel-junction-level (MTJ-level) material layers (112L, 114L, 130L, 144L, 148L) can be patterned into a two-dimensional array of magnetic tunnel junction (MTJ) pillar structures 184 including a respective magnetic tunnel junction (MTJ) 130 employing an anisotropic etch process. In one embodiment, unmasked portions of the magnetic-tunnel-junction-level (MTJ-level) material layers (112L, 114L, 130L, 144L, 148L) can be anisotropically etched employing an ion bean etch process. In one embodiment, the ion beam etch process vertically recesses portions of the upper selector electrode material layer 153L that are not masked by the two-dimensional array of discrete etch mask material portions (171, 176, 177). In one embodiment, one or more components of each discrete etch mask material portion (171, 176, 177) may be collaterally removed during patterning of the MTJ-level material layers (112L, 114L, 130L, 144L, 148L) into a two-dimensional array of magnetic tunnel junction (MTJ) pillar structures 184. For example, the second etch mask plates 177 may be collaterally removed during formation of the two-dimensional array of MTJ pillar structures 184. In one embodiment, remaining portions of the patterning film plates 176 may be removed, for example, by an oxidation process, such as plasma oxidation. The plasma oxidation process also removes any carbon-based material from the upper carbon-based electrode material layer 153C that is deposited on the sidewalls of the MTJ pillar structures 184 during the ion beam etching process.

Referring to FIGS. 9A-9C, a dielectric spacer material layer 178L can be formed over the two-dimensional array of MTJ pillar structures 184 and the selector material layers 150L. In one embodiment, the dielectric spacer material layer 178L can be conformally deposited around the two-dimensional array of MTJ pillar structures 184 such that it contacts the sidewalls of the MTJ pillar structures 184. In one embodiment, the dielectric spacer material layer 178L may comprise a dielectric material such as silicon nitride, silicon carbide nitride, silicon oxynitride, or silicon oxide. The dielectric spacer material layer 178L may comprise any suitable insulating material, such as silicon nitride, silicon oxide, silicon oxynitride, metal oxide (e.g., aluminum oxide, tantalum oxide, hafnium oxide, etc.) or other insulating material which acts as a protective liner for the sidewalls of the MTJ pillar structures 184 during a subsequent etching of underlying selector-level material layers 150L. The thickness of the dielectric spacer material layer 178L may be in a range from 1 nm to 60 nm, such as from 2 nm to 30 nm, although lesser and greater thicknesses may also be employed.

Referring to FIGS. 10A-10C, an anisotropic etch process including a first anisotropic etch step and a second anisotropic etch step can be performed. In one embodiment, the anisotropic etch process may comprise a reactive ion etch process including a first reactive ion etch step and a second reactive ion etch step. The first anisotropic etch step (which may comprise a first reactive ion sidewall spacer etch step) etches horizontally-extending portions of the dielectric spacer material layer 178L. The horizontally-extending portions of the dielectric spacer material layer 178L can be removed from above the two-dimensional array of MTJ pillar structures 184 and from above the top surface of the selector material layers 150L. Each remaining tubular vertically-extending portion of the dielectric spacer material layer 178L comprises a dielectric spacer 178 having a respective tubular configuration. A two-dimensional array of dielectric spacers (i.e., sidewall spacers) 178 can be formed around the two-dimensional array of MTJ pillar structures 184, such that the dielectric spacer 178 is formed around the respective MTJ pillar structure 184.

Referring to FIGS. 11A-11C, the second anisotropic etch step (which may be the second reactive ion etch step) can be performed to etch portions of the selector-level material layers 150L and the optional metallic adhesion layer 149L that are not masked by the combination of the two-dimensional array of MTJ pillar structures 84 and the two-dimensional array of dielectric spacers 178. The two-dimensional array of the first etch mask plates 171 and the two-dimensional array of dielectric spacers 178 can be employed as an etch mask for the second anisotropic etch step.

In one embodiment, the dielectric spacer material layer 178L and the selector material layers 150L can be anisotropically etched by performing an anisotropic etch process such as a reactive ion etch process. Vertically-extending portions of the dielectric spacer material layer 178L cover sidewalls of the two-dimensional array of MTJ pillar structures 184 throughout the anisotropic etch process. Remaining portions of the dielectric spacer material layer after 178L after anisotropically etching the dielectric spacer material layer 178L comprise a two-dimensional array of tubular dielectric spacers 178 laterally surrounding the two-dimensional array of MTJ pillar structures 184.

Patterned portions of the selector material layers 150L comprise a two-dimensional array of selector elements 150. Each selector element 150 is a patterned portion of the selector material layers 150L. Each selector element 150 may include a vertical stack of a lower selector electrode 151, a non-Ohmic selector material plate 152, and an upper selector electrode 153. Each lower selector electrode 151 is a patterned portion of the lower selector electrode material layer 151L. Each non-Ohmic selector material plate 152 is a patterned portion of the non-Ohmic material layer 152L. Each upper selector electrode 153 is a patterned portion of the upper selector electrode material layer 153L. Patterned portions of the metallic adhesion layer 149L comprise a two-dimensional array of metallic adhesion plates 149.

Each contiguous combination of an optional metallic adhesion plate 149 and a selector element 150 is herein referred to as a selector-containing pillar structure 182. The entirety of the outer sidewall of each selector-containing pillar structure 182 can be straight. In one embodiment, the two-dimensional array of selector-containing pillar structures 182 comprises a two-dimensional periodic array of selector-containing pillar structures 182 having the first pitch p1 along the first horizontal direction hd1 and having the second pitch p2 along the second horizontal direction hd2. The two-dimensional array of selector-containing pillar structures 182 can be formed over the electrically conductive lines 30.

Each of the tubular dielectric spacers 178 can laterally surround the respective MTJ pillar structure 184, and can have a respective outer sidewall having a bottom periphery that coincides with a top periphery of a sidewall of a respective underlying one of the selector-containing pillar structures 182. In one embodiment, the two-dimensional array of tubular dielectric spacers 178 comprises a two-dimensional array of annular bottom surfaces located below a horizontal plane including interfaces between topmost surfaces of the two-dimensional array of selector-containing pillar structures 182 (such as the top surfaces of the upper selector electrode 153) and bottom surfaces of the two-dimensional array of MTJ pillar structures 184.

In one embodiment shown in the inset in FIG. 11C, the upper selector electrode 153 within each selector-containing pillar structure 182 may comprise a base portion 153B having a first cylindrical surface segment CSS1 and a pedestal portion 153P overlying the base portion 153B and having a second cylindrical surface segment CSS2. The pedestal portion 153P may have a smaller lateral extent (i.e., smaller diameter or width) than the base portion 153B, and may be laterally offset inward from a cylindrical vertical plane including the first cylindrical surface segment CSS1. In one embodiment, a bottom periphery of the first cylindrical surface segment CSS1 coincides with a periphery of a top surface of the non-Ohmic selector material plate 152 within the same selector element 150. The second cylindrical surface segment CSS2 can be laterally offset inward from a cylindrical vertical plane including the first cylindrical surface segment CSS1 to form a step which includes an annular top surface ATS of the base portion 153B.

In one embodiment, a bottom periphery of the second cylindrical surface segment CSS2 is adjoined to an inner periphery of the annular top surface ATS of the base portion 153B, and an outer periphery of the annular top surface ATS of the base portion 153B is adjoined to a top periphery of the first cylindrical surface segment CSS1. In one embodiment, the second cylindrical surface segment CSS2 is laterally offset inward from the cylindrical vertical plane including the first cylindrical surface segment CSS1 by a uniform lateral offset distance that equals a lateral thickness of each tubular dielectric spacer 178 of the two-dimensional array of tubular dielectric spacers 178. In one embodiment, the second cylindrical surface segment CSS2 is in contact with a portion of an inner sidewall of a respective one of the tubular dielectric spacers 178, and the base portion 153B comprises the annular top surface ATS contacting an annular bottom surface of the respective one of the tubular dielectric spacers 178. In one embodiment, the tubular dielectric spacer 178 does not contact the entire respective selector-containing pillar structure 182. In one embodiment, the tubular dielectric spacer 178 does not contact the non-Ohmic selector material plate 152 and/or the lower selector electrode 151 of the underlying selector-containing pillar structure 182.

Each vertical stack of a selector-containing pillar structure 182, the optional seed layer 160, and an MTJ pillar structure 184 constitutes a memory cell 180 described with reference to FIGS. 1 and 2.

Referring to FIGS. 12A-12C, a dielectric fill material can be deposited over the two-dimensional array of tubular dielectric spacers 178 to form a dielectric matrix layer 80. The dielectric matrix layer 80 can be deposited directly on an outer sidewall of each selector-containing pillar structure 182 of the two-dimensional array of selector-containing pillar structures 182. The dielectric matrix layer 80 laterally surrounds the two-dimensional array of selector-containing pillar structures 182 and the two-dimensional array of tubular dielectric spacers 178. In other words, the dielectric matrix layer 80 surrounds each pillar shaped memory cell 180. In one embodiment, the dielectric matrix layer 80 contacts outer sidewalls of each tubular dielectric spacer 178 of the two-dimensional array of tubular dielectric spacers 178. In one embodiment, the dielectric matrix layer 80 contacts an entirety of an outer sidewall of each selector-containing pillar structure 182 of the two-dimensional array of selector-containing pillar structures 182.

Excess portions of the dielectric fill material of the dielectric matrix layer 80 can be removed from above a horizontal plane including top surfaces of the MTJ pillar structures 184 by a planarization process, such as a chemical mechanical polishing process. The first etch mask plates 171 can be collaterally removed during the planarization process. A top surface of the remaining portion of the dielectric matrix layer 80 can be formed within a horizontal plane including top surfaces of the two-dimensional array of MTJ pillar structures 184.

Figure 13A:
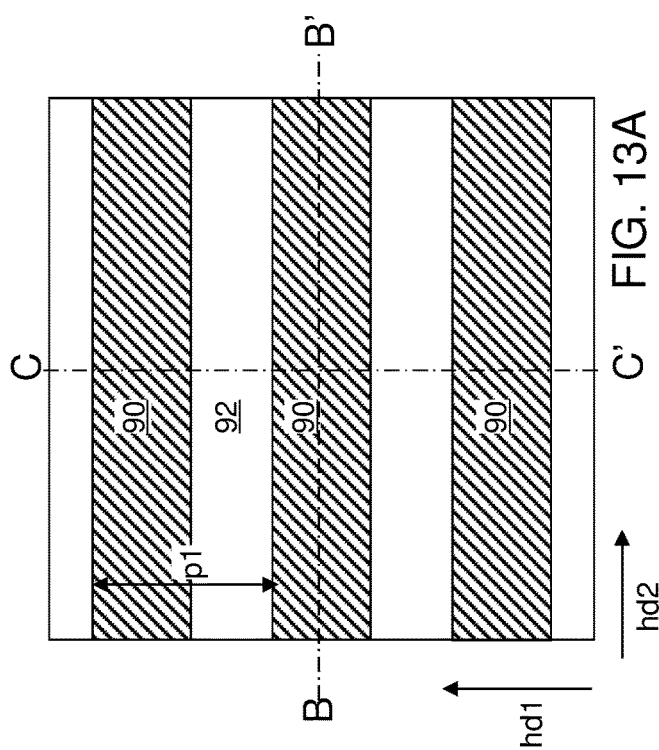
FIGS. 13A-13C are various views of the exemplary structure after formation of second electrically conductive lines according to an embodiment of the present disclosure.
Figure 13C:
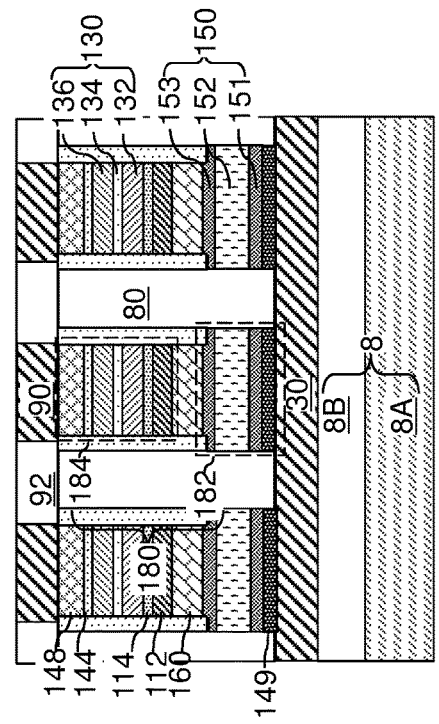
Figure 13B:
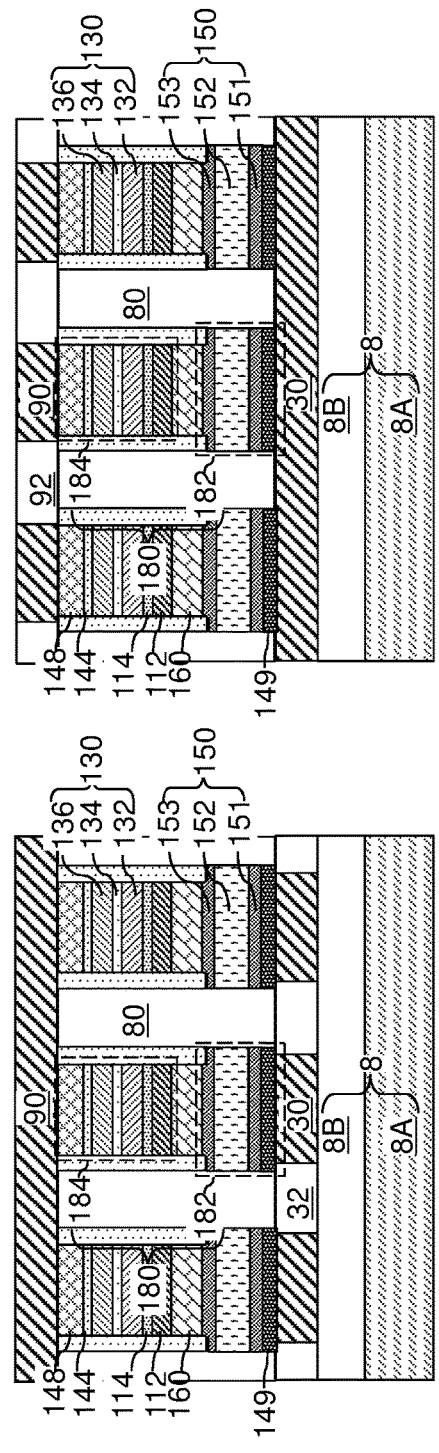

Referring to FIGS. 13A-13C, a dielectric material can be deposited over the two-dimensional array of MTJ pillar structures 184 to form a second line-level dielectric layer 92. Line trenches laterally extending along the second horizontal direction hd2 can be formed through the second line-level dielectric layer 92 above each column of MTJ pillar structures 184 arranged along the second horizontal direction hd2. A conductive material can be deposited in the line trenches, and excess portions of the conductive material can be removed from above the horizontal plane including the top surface of the second line-level dielectric layer 92. Remaining portions of the conductive material filling the line trenches constitute second electrically conductive lines 90. The second electrically conductive lines 90 comprise, and/or consist essentially of, a nonmagnetic electrically conductive material such as Al, Cu, W, Ru, Mo, Nb, Ti, Ta, TiN, TaN, WN, MoN, or combinations thereof. The thickness of the second electrically conductive lines 90 can be in a range from 20 nm to 100 nm, although lesser and greater thicknesses can also be employed. Alternatively, instead of using the above-described damascene process to form the second electrically conductive lines 90, these lines may be formed by the above-described pattern and etch process.

In one embodiment, the two-dimensional array of tubular dielectric spacers 178 comprises a two-dimensional array of annular top surfaces located within a horizontal plane including interfaces between the two-dimensional array of MTJ pillar structures 184 and the second electrically conductive lines 90. In one embodiment, the dielectric matrix layer 80 comprises a top surface located within a horizontal plane including interfaces between the two-dimensional array of MTJ pillar structures 184 and the second electrically conductive lines 90.

Referring to all drawings and according to various embodiments of the present disclosure, a memory array is provided, which comprises: first electrically conductive lines 30 laterally extending along a first horizontal direction hd1 and laterally spaced apart from each other along a second horizontal direction; a two-dimensional array of selector-containing pillar structures 182 located over the first electrically conductive lines 30 and including a respective selector element; a two-dimensional array of magnetic tunnel junction (MTJ) pillar structures 184 located over the two-dimensional array of selector-containing pillar structures 182 and including a respective magnetic tunnel junction (MTJ); a two-dimensional array of tubular dielectric spacers 178 laterally surrounding the two-dimensional array of MTJ pillar structures 184 and having a respective outer sidewall having a bottom periphery that coincides with a top periphery of a sidewall of a respective underlying one of the selector-containing pillar structures 182; and second electrically conductive lines 90 laterally extending along the second horizontal direction and overlying the two-dimensional array of MTJ pillar structures 184.

In one embodiment, the memory array comprises a dielectric matrix layer 80 laterally surrounding the two-dimensional array of selector-containing pillar structures 182 and the two-dimensional array of tubular dielectric spacers 178. In one embodiment, the dielectric matrix layer 80 contacts outer sidewalls of each tubular dielectric spacer 178 of the two-dimensional array of tubular dielectric spacers 178. In one embodiment, the dielectric matrix layer 80 contacts an entirety of an outer sidewall of each selector-containing pillar structure 182 of the two-dimensional array of selector-containing pillar structures 182. In one embodiment, the dielectric matrix layer 80 comprises a top surface located within a horizontal plane including interfaces between the two-dimensional array of MTJ pillar structures 184 and the second electrically conductive lines 90.

In one embodiment, the two-dimensional array of tubular dielectric spacers 178 comprises a two-dimensional array of annular top surfaces located within a horizontal plane including interfaces between the two-dimensional array of MTJ pillar structures 184 and the second electrically conductive lines 90. In one embodiment, the two-dimensional array of tubular dielectric spacers 178 comprises a two-dimensional array of annular bottom surfaces located below a horizontal plane including interfaces between topmost surfaces of the two-dimensional array of selector-containing pillar structures 182 and bottom surfaces of the two-dimensional array of MTJ pillar structures 184.

In one embodiment, each selector-containing pillar structure 182 of the two-dimensional array of selector-containing pillar structures 182 comprises a vertical stack including a lower selector electrode 151, a non-Ohmic selector material plate 152 overlying the lower selector electrode 151, and an upper selector electrode 153 overlying the non-Ohmic selector material plate 152.

In one embodiment, the upper selector electrode 153 within each selector-containing pillar structure 182 comprises: a base portion 153B having a first cylindrical surface segment CSS1, wherein a bottom periphery of the first cylindrical surface segment CSS1 coincides with a periphery of a top surface of the non-Ohmic selector material plate 152; and a pedestal portion 153P overlying the base portion 153B and having a second cylindrical surface segment CSS2 that is laterally offset inward from a cylindrical vertical plane including the first cylindrical surface segment CSS1.

In one embodiment, a bottom periphery of the second cylindrical surface segment CSS2 is adjoined to an inner periphery of an annular top surface ATS of the base portion 153B; and an outer periphery of the annular top surface ATS of the base portion 153B is adjoined to a top periphery of the first cylindrical surface segment CSS1.

In one embodiment, the second cylindrical surface segment CSS2 is laterally offset inward from the cylindrical vertical plane including the first cylindrical surface segment CSS1 by a uniform lateral offset distance that equals a lateral thickness of each tubular dielectric spacer 178 among the two-dimensional array of tubular dielectric spacers 178.

In one embodiment, the second cylindrical surface segment CSS2 is in contact with a portion of an inner sidewall of a respective one of the tubular dielectric spacers 178; and the base portion 153B comprises an annular top surface contacting an annular bottom surface of the respective one of the tubular dielectric spacers 178.

The various embodiments of the present disclosure may provide a magnetoresistive memory device in which sidewalls of magnetic tunnel junctions 130 are protected by tubular dielectric spacers from ion damage during patterning of underlying selector-containing pillar structures 182.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory array, comprising:
   first electrically conductive lines laterally extending along a first horizontal direction and laterally spaced apart from each other along a second horizontal direction;
   a two-dimensional array of selector-containing pillar structures located over the first electrically conductive lines and including a respective selector element;
   a two-dimensional array of magnetic tunnel junction (MTJ) pillar structures located over the two-dimensional array of selector-containing pillar structures and including a respective magnetic tunnel junction (MTJ);
   a two-dimensional array of tubular dielectric spacers laterally surrounding the two-dimensional array of MTJ pillar structures and having a respective outer sidewall having a bottom periphery that coincides with a top periphery of a sidewall of a respective underlying one of the selector-containing pillar structures; and
   second electrically conductive lines laterally extending along the second horizontal direction and overlying the two-dimensional array of MTJ pillar structures;
   wherein each selector-containing pillar structure of the two-dimensional array of selector-containing pillar structures comprises a vertical stack including a lower selector electrode, a non-Ohmic selector material plate overlying the lower selector electrode, and an upper selector electrode overlying the non-Ohmic selector material plate; and
   wherein the upper selector electrode within each selector-containing pillar structure comprises:
   a base portion having a first cylindrical surface segment, wherein a bottom periphery of the first cylindrical surface segment coincides with a periphery of a top surface of the non-Ohmic selector material plate; and
   a pedestal portion overlying the base portion and having a second cylindrical surface segment that is laterally offset inward from a cylindrical vertical plane including the first cylindrical surface segment.

2. The memory device of claim 1, wherein a bottom periphery of the second cylindrical surface segment is adjoined to an inner periphery of an annular top surface of the base portion.

3. The memory device of claim 2, wherein an outer periphery of the annular top surface of the base portion is adjoined to a top periphery of the first cylindrical surface segment.

4. The memory device of claim 1, wherein the second cylindrical surface segment is laterally offset inward from the cylindrical vertical plane including the first cylindrical surface segment by a uniform lateral offset distance that equals a lateral thickness of each tubular dielectric spacer of the two-dimensional array of tubular dielectric spacers.

5. The memory device of claim 1, wherein:
   the second cylindrical surface segment is in contact with a portion of an inner sidewall of a respective one of the tubular dielectric spacers; and
   the base portion comprises an annular top surface contacting an annular bottom surface of the respective one of the tubular dielectric spacers.

* * * * *